United States Patent
Ha et al.

(10) Patent No.: US 7,876,136 B2
(45) Date of Patent: Jan. 25, 2011

(54) PHASE-LOCKED-LOOP CIRCUIT HAVING A PRE-CALIBRATION FUNCTION AND METHOD OF PRE-CALIBRATING THE SAME

(75) Inventors: Soh-Myung Ha, Gyeonggi-do (KR); Woo-Seok Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 12/060,466

(22) Filed: Apr. 1, 2008

(65) Prior Publication Data
US 2008/0246546 A1     Oct. 9, 2008

(30) Foreign Application Priority Data
Apr. 4, 2007 (KR) .................... 10-2007-0033327

(51) Int. Cl.
*H03L 7/06* (2006.01)
(52) U.S. Cl. ...................... 327/157; 327/148
(58) Field of Classification Search ................ None
See application file for complete search history.

(56) References Cited

U.S. PATENT DOCUMENTS

| | | | |
|---|---|---|---|
| 6,191,657 B1 * | 2/2001 | Brunet et al. | 331/1 A |
| 6,870,411 B2 * | 3/2005 | Shibahara et al. | 327/156 |
| 7,274,764 B2 * | 9/2007 | Loke et al. | 375/373 |
| 7,504,894 B2 * | 3/2009 | Kawamoto et al. | 331/44 |
| 7,508,244 B2 * | 3/2009 | Hallivuori | 327/156 |
| 7,519,140 B2 * | 4/2009 | Yoshimura | 375/376 |
| 2003/0085743 A1* | 5/2003 | Ullmann et al. | 327/156 |

FOREIGN PATENT DOCUMENTS

| | | |
|---|---|---|
| JP | 2003-078410 | 3/2003 |
| JP | 2005-260866 | 9/2005 |
| KR | 1020000008299 | 2/2000 |

* cited by examiner

*Primary Examiner*—Cassandra Cox
(74) *Attorney, Agent, or Firm*—Myers Bigel Sibley & Sajovec

(57) ABSTRACT

A phase-locked loop (PLL) integrated circuit includes an oscillation control voltage generating circuit therein. The oscillation control voltage generating circuit is configured to pre-scale an output current of a charge pump therein to a first level in response to disposing the PLL integrated circuit into a pre-calibration mode of operation. The oscillation control voltage generating circuit may be responsive to an input signal (e.g., SIN) and a feedback signal (e.g., SFEED), and the magnitude of the first level of the charge pump current during the pre-calibration mode of operation may be independent of any phase difference between the input signal and the feedback signal.

15 Claims, 16 Drawing Sheets

3000a

PHASE-LOCKED-LOOP CIRCUIT HAVING A PRE-CALIBRATION FUNCTION AND METHOD OF PRE-CALIBRATING THE SAME

REFERENCE TO PRIORITY APPLICATION

This application claims priority under 35 USC §119 to Korean Patent Application No. 2007-33327, filed on Apr. 4, 2007 in the Korean Intellectual Property Office (KIPO), the disclosure of which is hereby incorporated herein in its entirety by reference.

FIELD OF THE INVENTION

The present invention relates to integrated circuit devices and, more particularly, to phase-locked loop integrated circuits.

BACKGROUND OF THE INVENTION

Phase-locked loop (PLL) circuits are widely used to provide clocks for operations of circuit blocks. PLL circuits are used in a variety of modern electronic systems including communication systems, multimedia systems and various other applications such as frequency synthesizers, FM demodulators, clock recovery circuits and tone decoders.

FIG. 1 is a block diagram illustrating a conventional phase-locked-loop circuit. Referring to FIG. 1, the PLL circuit 100 includes a phase/frequency detector (PFD) 110, a charge pump 130, a loop filter 140, a voltage-controlled oscillator (VCO) 150, a frequency divider 160, and a fractional frequency divider 165. The PFD 110 generates an up signal UP and a down signal DN based on a phase difference and a frequency difference between an input signal SIN and a feedback signal SFEED. The charge pump 130 generates a charge current and a discharge current, based on the up signal UP and the down signal DN. The loop filter 140 integrates the charge current and the discharge current to generate an oscillation control voltage VCON. The loop filter 140 may include a capacitor, which is electrically coupled between the charge pump 130 and the VCO 150. Therefore, the oscillation control voltage VCON is determined according to an integrated value of the output current IOUT. The VCO 150 generates an oscillation output signal SOUT of which a frequency varies according to a magnitude of the oscillation control voltage VCON. The frequency divider 160 divides a frequency of the oscillation output signal SOUT by an integer. The fractional frequency divider 165 may include a delta-sigma modulator, and divide the frequency of the oscillation output signal SOUT by a fractional number.

When there is a mismatch between an up current and a down current of the charge pump, the performance of the PLL circuit 100 may be degraded. The up current is a current that charges the loop filter, and the down current is a current that discharges the loop filter. When the PLL circuit 100 is in a locked state, the oscillation control voltage VCON is expected to have a constant value. However, when a mismatch is generated between the up current and the down current of the charge pump, the oscillation control voltage VCON may include a ripple even when the PLL circuit 100 is in the locked state. When the oscillation control voltage VCON has a ripple, the output signal of the PLL circuit 100 may include a jitter and a reference spur having large value.

In particular, in the PLL circuit having a fractional frequency divider, the performance of the PLL circuit may be further degraded when there is a mismatch between an up current and a down current of the charge pump. When there is a mismatch between an up current and a down current of the charge pump, the noise generated in the delta-sigma modulator and the in-band noise of the PLL circuit may be increased, and the output signal of the PLL circuit may include a jitter having large value.

The mismatch between the up current and the down current of the charge pump may be decreased by adjusting the size of a PMOS transistor and an NMOS transistor constituting the charge pump. However, there is a limit related to variations in manufacturing processes and variations of the oscillation control voltage that decrease the mismatch between the up current and the down current of the charge pump.

SUMMARY OF THE INVENTION

Phase-locked loop (PLL) integrated circuits according to embodiments of the present invention include an oscillation control voltage generating circuit therein. The oscillation control voltage generating circuit is configured to pre-scale an output current of a charge pump therein to a first level in response to disposing the PLL integrated circuit into a pre-calibration mode of operation. According to some of these embodiments of the invention, the oscillation control voltage generating circuit is responsive to an input signal (e.g., SIN) and a feedback signal (e.g., SFEED), and the magnitude of the first level of the charge pump current during the pre-calibration mode of operation is independent of any phase difference between the input signal and the feedback signal. The PLL integrated circuit may also include a voltage-controlled oscillator (VCO), which is configured to receive a first oscillation control voltage generated by the oscillation control voltage generating circuit during a normal mode of operation. An automatic frequency controller (AFC) may also be provided. The AFC may be configured to generate a second oscillation control voltage and the voltage-controller oscillator may be responsive to the second oscillation control voltage, but not the first oscillation control voltage, during the pre-calibration mode of operation.

According to further embodiments of the present invention, circuitry may be provided for blocking transfer of the first oscillation control voltage from the oscillation control voltage generating circuit to the voltage-controller oscillator during the pre-calibration mode of operation. This circuitry may constitute means that is electrically coupled to the voltage-controlled oscillator and the oscillation control voltage generating circuit. In some of embodiments of the invention, the circuitry for blocking transfer may include a CMOS transmission gate, which is responsive to a pre-calibration enable signal. The circuitry for blocking transfer may also include a multiplexer having a control terminal responsive to the pre-calibration enable signal.

DESCRIPTION OF THE EMBODIMENTS

Figure 1:
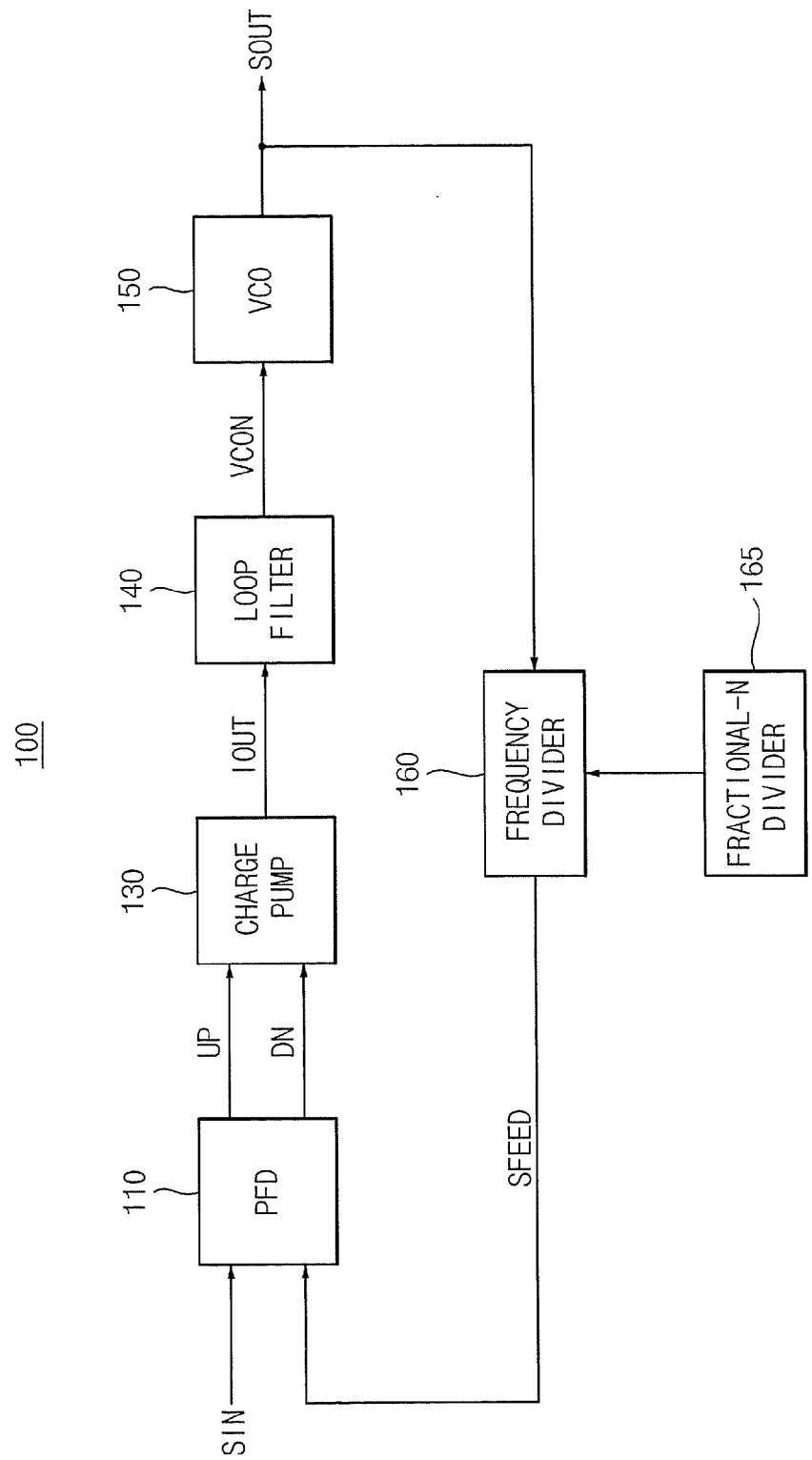
FIG. 1 is a block diagram illustrating a conventional phase-locked-loop circuit.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
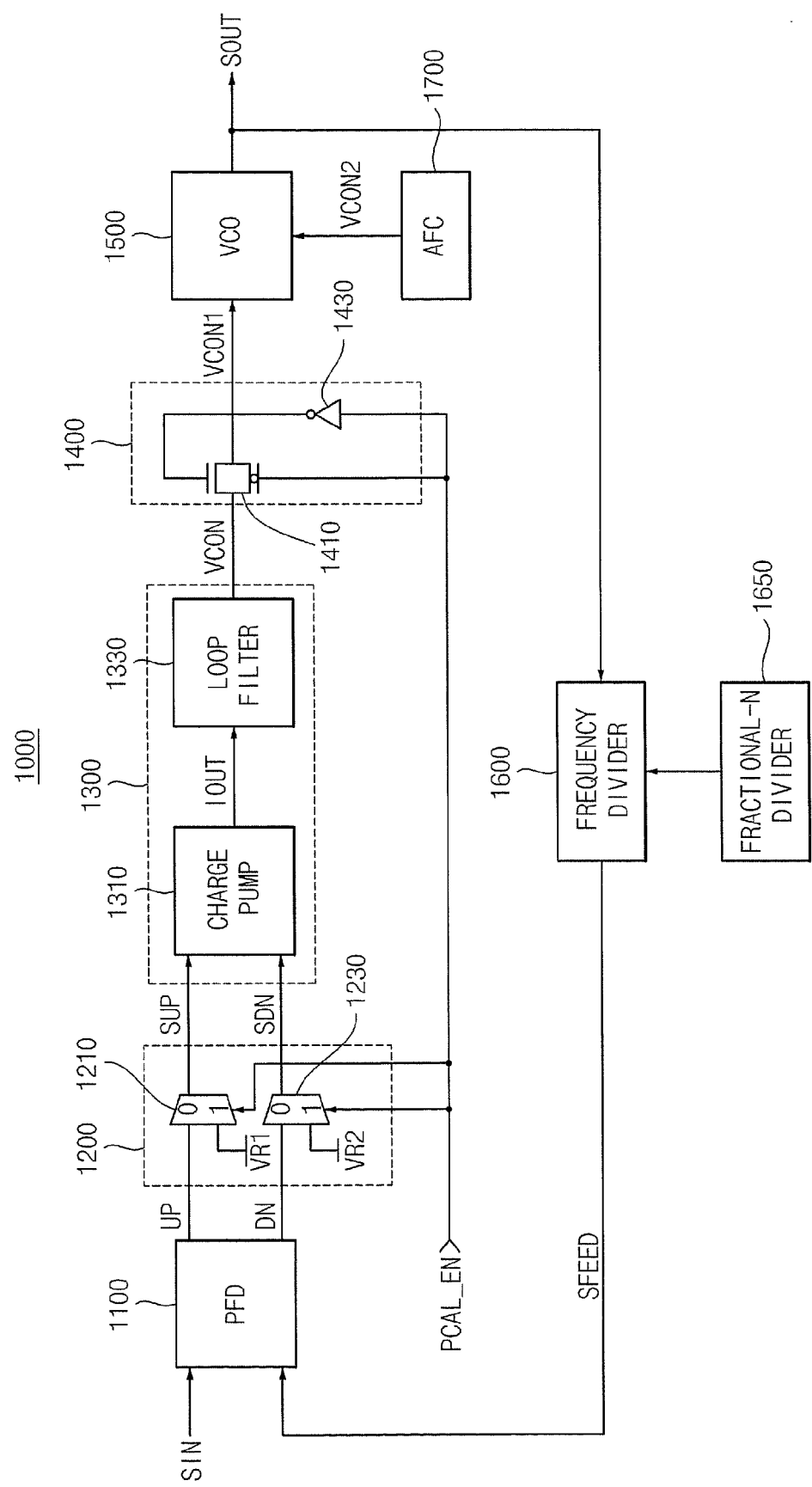
FIG. 2 is a circuit diagram illustrating a phase-locked-loop circuit according to a first example embodiment of the present invention.

FIG. 2 is a circuit diagram illustrating a phase-locked-loop circuit according to a first example embodiment of the present invention. Referring to FIG. 2, the phase-locked-loop circuit 1000 includes an oscillation control voltage generating circuit, a voltage-controlled oscillator (VCO) 1500, a frequency divider 1600, a fractional frequency divider 1650 and an automatic frequency controller (AFC) 1700. The oscillation control voltage generating circuit includes a phase/frequency detector (PFD) 1100, a first selection circuit 1200, an oscillation control voltage-generating unit 1300 and a first switch 1400. The oscillation control voltage-generating unit 1300 may include a charge pump 1310 and a loop filter 1330.

The oscillation control voltage generating circuit performs pre-scaling on a pump output current IOUT in a pre-calibration mode to generate a first oscillation control voltage VCON1. The voltage-controlled oscillator 1500 generates an oscillation output signal SOUT that is oscillating with a frequency in response to the first oscillation control voltage VCON1 and a second oscillation control voltage VCON2. The second oscillation control voltage VCON2 is generated by the automatic frequency controller 1700. The frequency divider 1600 divides a frequency of the oscillation output signal SOUT to generate a first feedback signal SFEED, and provides the first feedback signal SFEED to the oscillation control voltage generating circuit. The fractional frequency divider 1650 divides the frequency of the oscillation output signal SOUT with a fractional number by controlling the frequency divider 1600. The fractional frequency divider 1650 may include a delta-sigma modulator (not shown).

The phase/frequency detector (PFD) 1100 generates a first up signal UP and a first down signal DN corresponding to a phase difference between an input signal SIN and the first feedback signal SFEED. The first selection circuit 1200 multiplexes the first up signal UP and a first reference voltage VR1 to generate a second up signal SUP and multiplexes the first down signal DN and a second reference voltage VR2 to generate a second down signal SDN in response to a pre-calibration enable signal PCAL_EN. The first selection circuit 1200 may include multiplexers 1210 and 1230.

The oscillation control voltage generating unit 1300 generates the pump output current IOUT based on the second up signal SUP and the second down signal SDN, and integrates the pump output current IOUT to generate a first control voltage VCON. The charge pump 1310 generates an up current and a down current in response to the second up signal SUP and the second down signal SDN. That is, the charge pump 1310 generates the pump output current IOUT corresponding to a magnitude difference between the up current for charging the loop filter 1330 and the down current for discharging the loop filter 1330, in response to the second up signal SUP and the second down signal SDN. The loop filter 1330 integrates the pump output current IOUT to generate the first control voltage VCON. The first switch 1400 outputs the first oscillation control voltage VCON1 corresponding to the first control voltage VCON in response to the pre-calibration enable signal PCAL_EN. The first switch 1400 may include a transmission gate 1410 and an inverter 1430.

Hereinafter, the operation of the phase-locked-loop circuit of FIG. 2 will be described. The phase-locked-loop circuit of FIG. 2 operates in a pre-calibration mode and in a normal mode. In the pre-calibration mode, the pre-calibration enable signal PCAL_EN is enabled. When the pre-calibration enable signal PCAL_EN is logic "high" state, the first selection circuit 1200 outputs the first reference voltage VR1 as the second up signal SUP and the second reference voltage VR2 as the second down signal SDN. Further, when the pre-calibration enable signal PCAL_EN is logic "high" state, the first switch 1400 is turned off, and the oscillation control voltage-generating unit 1300 is electrically decoupled from the voltage-controlled oscillator 1500. In this condition, the oscillation control voltage-generating unit 1300 performs a pre-calibration operation. The first reference voltage VR1, which is applied to the first selection circuit 1200, may have logic "high" state and the second reference voltage VR2 may have logic "high" state. The first reference voltage VR1 may be a power supply voltage (VDD) and the second reference voltage VR2 may be a power supply voltage (VDD). When the pre-calibration operation is completed, the magnitude of the up current and the down current becomes equal, and the magnitude of the pump output current IOUT becomes zero. Then, the first control voltage VCON has a constant value.

The phase-locked-loop circuit 1000 may operate in the normal mode after the pre-calibration operation is completed. In the normal mode, the pre-calibration enable signal PCAL_EN is disabled. When the pre-calibration enable signal PCAL_EN has logic "low" state, the first selection circuit 1200 outputs a first up signal UP as a second up signal SUP and the first down signal DN as a second down signal SDN. Further, when the pre-calibration enable signal PCAL_EN has logic "low" state, the first switch 1400 outputs the first control voltage VCON as the oscillation control voltage VCON1.

In the normal mode, the phase-locked-loop circuit 1000 compares a phase and frequency of the input signal SIN and the first feedback signal SFEED. The phase-locked-loop circuit 1000 outputs the oscillation output signal SOUT that is synchronized with the input signal SIN and having a frequency of integer times or fractional times of the input signal SIN according to a division ratio in the process of feedback.

Therefore, the phase-locked-loop circuit 1000 of FIG. 2 maintains the magnitude of the up current and the down current equal, and performs pre-calibration before entering the normal mode to maintain the pump output current IOUT zero. When synchronizing between the input signal SIN and the first feedback signal SFEED is performed by the phase-locked-loop circuit 1000 after the pre-calibration operation is completed, the amount of noise that may be included in the oscillation output signal SOUT may be decreased.

Figure 3:
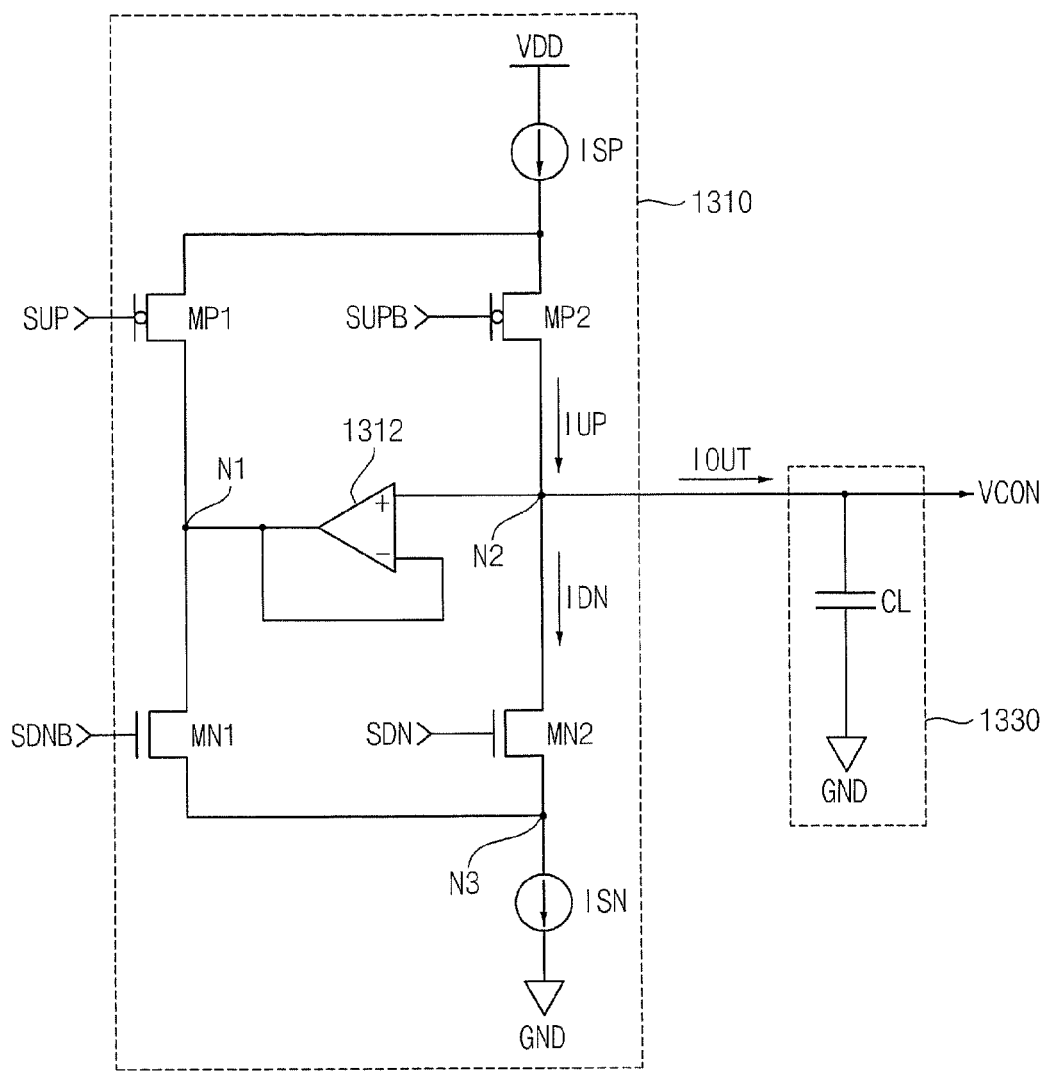
FIG. 3 is a circuit diagram illustrating an oscillation-control-voltage generating circuit that is included in the phase-locked-loop circuit of FIG. 2.

FIG. 3 is a circuit diagram illustrating an oscillation-control-voltage generating circuit 1300 that is included in the phase-locked-loop circuit 1000 of FIG. 2. Referring to FIG. 3, the oscillation-control-voltage generating circuit 1300 includes a charge pump 1310 and a loop filter 1330. The charge pump 1310 includes a first current source ISP, a second current source ISN, a first PMOS transistor MP1, a second PMOS transistor MP2, a first NMOS transistor MN1, a second NMOS transistor MN2 and a unit gain amplifier 1312, connected as illustrated. The loop filter 1330 includes a capacitor CL coupled between a second node N2 and the ground voltage GND. The first control voltage VCON is outputted from the second node N2.

Hereinafter, the operation of the oscillation-control-voltage generating circuit 1300a shown in FIG. 3 will be described. Referring to FIG. 3, the unit gain amplifier 1312 is an operational amplifier in which a negative (−) input terminal is coupled to an output terminal of the operational amplifier, and operates as a voltage follower. Therefore, the unit-gain amplifier 1312 functions to maintain the voltage magnitude of a first node N1 and the voltage magnitude of the second node N2 equal. When the voltage magnitude of the first node N1 and the voltage magnitude of the second node N2 are equal, the drain-source voltage of the first PMOS transistor MP1 is equal to the drain-source voltage of the second PMOS transistor MP2. In the same way, when the voltage magnitude of the first node N1 and the voltage magnitude of the second node N2 are equal, the drain-source voltage of the first NMOS transistor MN1 is equal to the drain-source voltage of the second NMOS transistor MN2. In general, if the drain-source voltage of an NMOS transistor is changed, the drain current of the NMOS transistor may be changed even though the same gate voltage is applied.

When the voltage magnitude of the first node N1 and the voltage magnitude of the second node N2 are equal, the current flowing through the first PMOS transistor MP1 when the first PMOS transistor MP1 is turned on may be equal to the current flowing through the second PMOS transistor MP2 when the second PMOS transistor MP2 is turned. In the same way, when the voltage magnitude of the first node N1 and the voltage magnitude of the second node N2 are equal, the current flowing through the first NMOS transistor MN1 when the first NMOS transistor MN1 is turned on may be equal to the current flowing through the second NMOS transistor MN2 when the second NMOS transistor MN2 is turned. In FIG. 3, SUPB denotes an inverted signal of the second up signal SUP, and SDNB denotes an inverted signal of the second down signal SDN.

In the pre-calibration mode, the second up signal SUP may be a voltage corresponding to the first reference voltage VR1, and the second down signal SDN may be a voltage corresponding to the second reference voltage VR2. The first reference voltage VR1 has a logic "high" state, and the second reference voltage VR2 has a logic "high" state. In the pre-calibration mode, when the second up signal SUP has a logic "high" state, the inverted signal of the second up signal SUP has a logic "low" state. When the power supply voltage (VDD) is applied as the second up signal SUP and the power supply voltage (VDD) is applied as the second down signal SDN, the second PMOS transistor MP2 and the NMOS transistor MN2 are both turned on.

When a mismatch is generated between the up current IUP and the down current IDN of the charge pump 1310 by a process variation and a temperature variation, the magnitude of the up current IUP may not be equal to the magnitude of the down current IDN. For example, when the magnitude of the up current IUP is larger than the magnitude of the down current IDN, the magnitude of the pump output current IOUT may be increased and the magnitude of the first control voltage VCON may be increased. When the first control voltage VCON is increased, the magnitude of the up current IUP flowing through the second PMOS transistor MP2 is decreased because the drain-source voltage of the second PMOS transistor MP2 is decreased. Further, when the first control voltage VCON is increased, the magnitude of the down current IDN flowing through the second NMOS transistor MN2 is increased because the drain-source voltage of the second NMOS transistor MN2 is increased. Finally, the magnitude of the up current IUP becomes equal to the magnitude of the down current IDN.

When the magnitude of the up current IUP is less than the magnitude of the down current IDN, the magnitude of the pump output current IOUT may be decreased and the magnitude of the first control voltage VCON may be decreased. When the first control voltage VCON is decreased, the magnitude of the up current IUP flowing through the second PMOS transistor MP2 is increased because the drain-source voltage of the second PMOS transistor MP2 is increased. Further, when the first control voltage VCON is decreased, the magnitude of the down current IDN flowing through the second NMOS transistor MN2 is decreased because the drain-source voltage of the second NMOS transistor MN2 is decreased. Finally, the magnitude of the up current IUP becomes equal to the magnitude of the down current IDN.

When the pre-calibration operation is completed, the phase-locked-loop circuit 1000 operates in the normal mode. In the normal mode, the second up signal SUP may be a voltage corresponding to the first up signal UP, and the second down signal SDN may be a voltage corresponding to the first down signal DN. When the magnitude of the second up signal SUP is increased and the magnitude of the second down signal SDN is decreased, the magnitude of the up current IUP flowing through the second PMOS transistor MP2 is increased and the magnitude of the down current IDN flowing through the second NMOS transistor MN2 is decreased. Therefore, the magnitude of the pump output current IOUT may be increased and the magnitude of the first control voltage VCON may be increased.

When the magnitude of the second up signal SUP is decreased and the magnitude of the second down signal SDN is increased, the magnitude of the up current IUP flowing through the second PMOS transistor MP2 is decreased and the magnitude of the down current IDN flowing through the second NMOS transistor MN2 is increased. Therefore, the magnitude of the pump output current IOUT may be decreased and the magnitude of the first control voltage VCON may be decreased.

Figure 4:
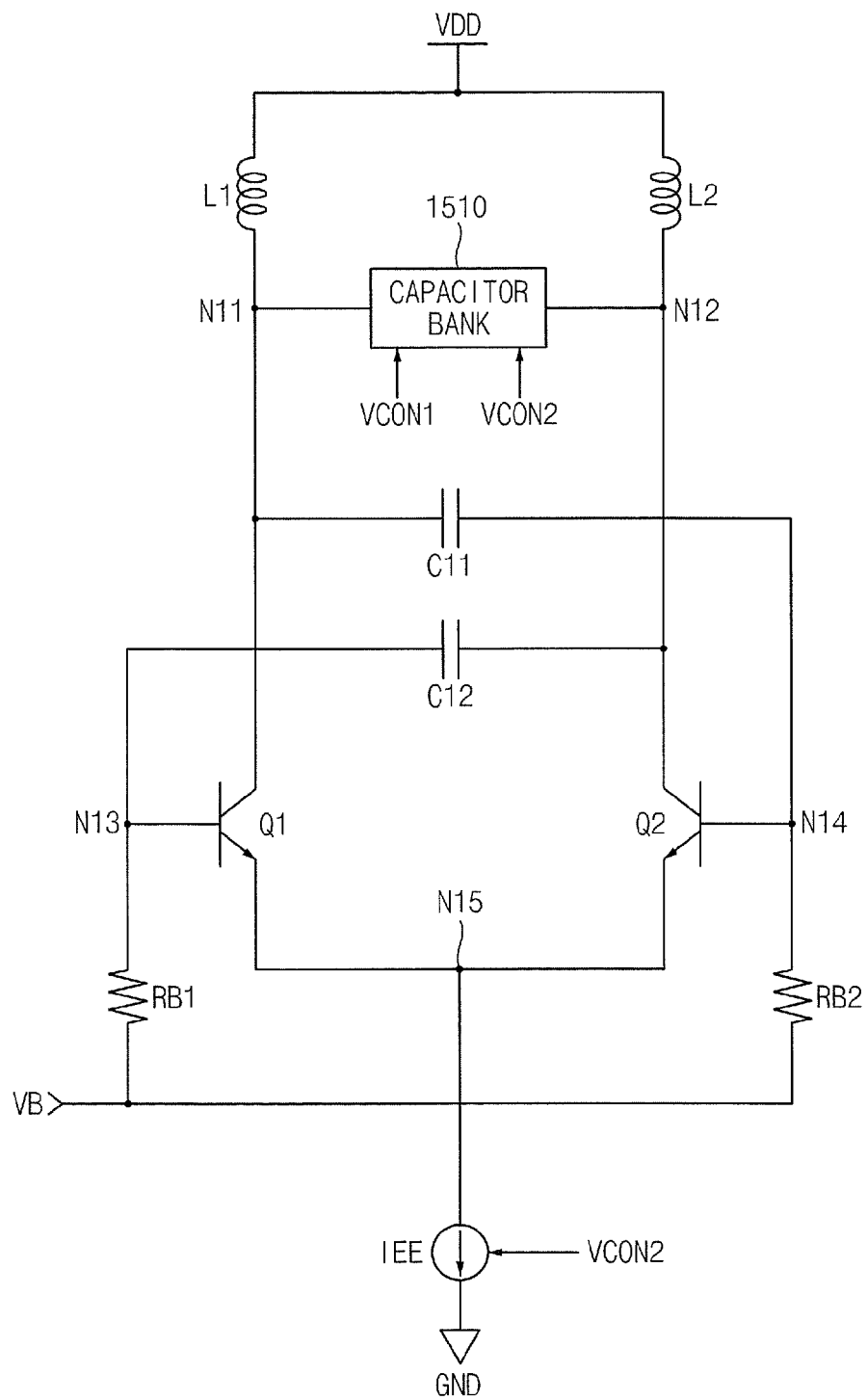
FIG. 4 is a circuit diagram illustrating a voltage-controlled oscillator that is included in the phase-locked-loop circuit of FIG. 2.

FIG. 4 is a circuit diagram illustrating a voltage-controlled oscillator that is included in the phase-locked-loop circuit of FIG. 2. Referring to FIG. 4, the voltage-controlled oscillator 1500 includes a first inductor L1, a second inductor L2, a capacitor bank 1510, a first capacitor C12, a second capacitor C11, a first NPN bipolar transistor Q1, a second NPN bipolar transistor Q2, a first bias resistor RB1, a second bias resistor RB2 and a current source IEE. The first inductor L1 is coupled between the power supply voltage VDD and the first node N11, and the second inductor L2 is coupled between the power supply voltage VDD and the second node N12. The capacitor bank 1510 is coupled between the first node N11 and the second node N12, and controlled by a first oscillation control voltage VCON1 and a second oscillation control voltage VCON2. The first capacitor C12 is coupled between the second node N12 and a third node N13, and the second capacitor C11 is coupled between the first node N11 and a fourth node N14. The first NPN transistor Q1 has a collector coupled to the first node N11, a base coupled to the third node N13, and an emitter coupled to a fifth node N15. The second NPN transistor Q2 has a collector coupled to the second node N12, a base coupled to the fourth node N14, and an emitter coupled to the fifth node N15. The first bias resistor RB1 has a first terminal coupled to the third node N13, and the second bias resistor RB2 has a first terminal coupled to the fourth node N14. A bias voltage VB is applied to a second terminal of the first bias resistor RB1 and a second terminal of the second bias voltage RB2. The current source IEE is coupled between the fifth node N15 and the ground voltage GND, and controlled by the second oscillation control voltage VCON2.

Figure 5:
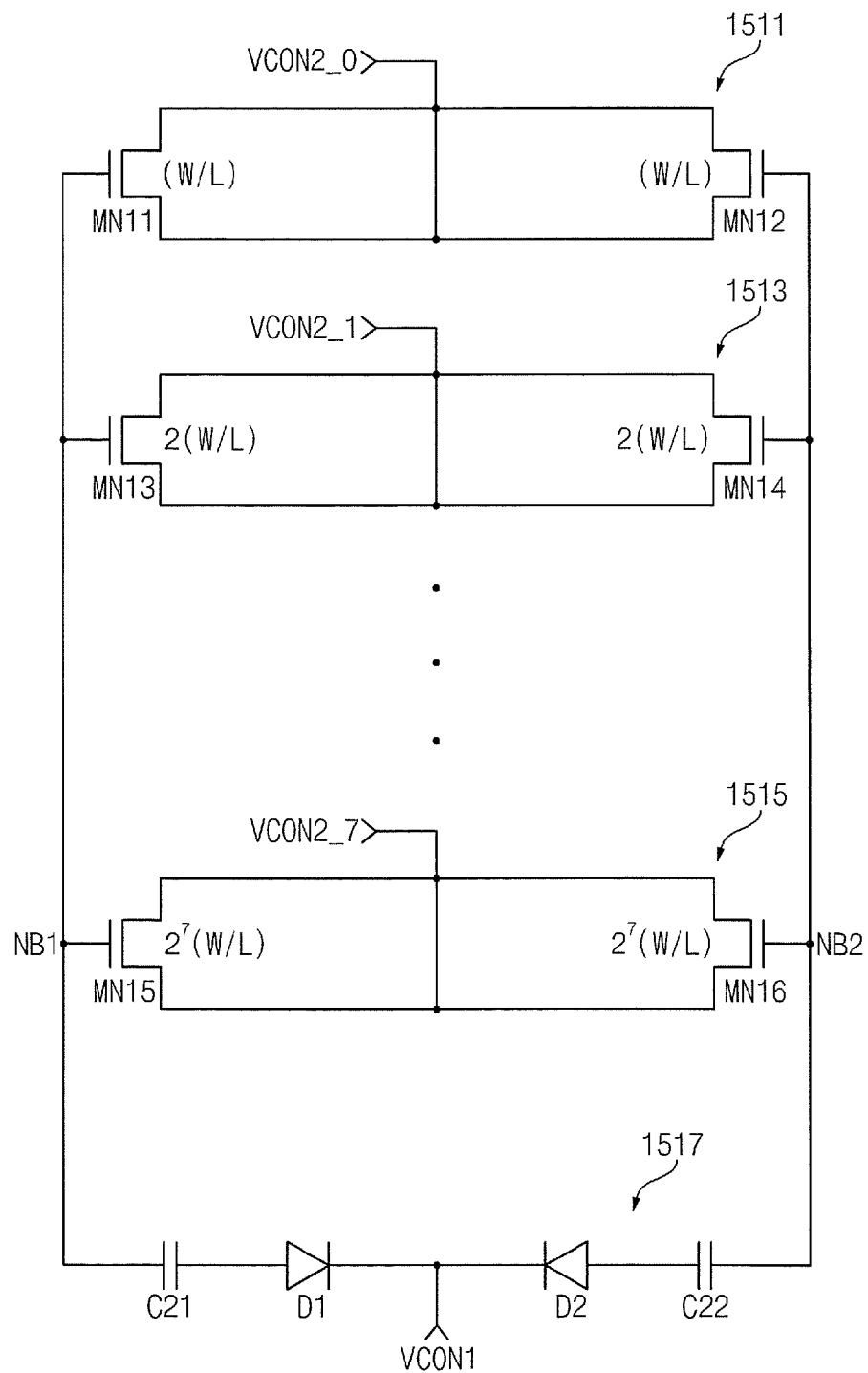
FIG. 5 is a circuit diagram illustrating a capacitor bank that is included in the voltage-controlled oscillator of FIG. 4.

FIG. 5 is a circuit diagram illustrating a capacitor bank 1510 that is included in the voltage-controlled oscillator 1500 of FIG. 4. In the example of FIG. 5, the second oscillation control voltage VCON2 is a digital signal comprised of eight bits VCON2_0, VCON2_1, VCON2_2, VCON2_3, VCON2_4, VCON2_5, VCON2_6 and VCON2_7. Referring to FIG. 5, the capacitor bank 1510 includes capacitor branches 1511, 1513, 1515 and 1517. The first branch 1511 includes a first NMOS transistor MN11 and a second NMOS transistor MN12. A drain and source of the first NMOS transistor MN11 and a drain and source of the second NMOS transistor MN12 are electrically coupled together, and the first bit VCON2_0 of the second oscillation control voltage VCON2 is applied to the coupling point. A gate of the first NMOS transistor MN11 is coupled to a first node NB1 and a gate of the second NMOS transistor MN12 is coupled to the second node NB2.

The second branch 1513 includes a third NMOS transistor MN13 and a fourth NMOS transistor MN14. A drain and source of the third NMOS transistor MN13 and a drain and source of the fourth NMOS transistor MN14 are electrically coupled together, and the second bit VCON2_1 of the second oscillation control voltage VCON2 is applied to the coupling point. A gate of the third NMOS transistor MN13 is coupled to a first node NB1 and a gate of the fourth NMOS transistor MN14 is coupled to the second node NB2.

The eighth branch 1515 includes a fifth NMOS transistor MN15 and a sixth NMOS transistor MN16. A drain and source of the fifth NMOS transistor MN15 and a drain and source of the sixth NMOS transistor MN16 are electrically coupled together, and the eighth bit VCON2_7 of the second oscillation control voltage VCON2 is applied to the coupling point. A gate of the fifth NMOS transistor MN15 is coupled to a first node NB1 and a gate of the sixth NMOS transistor MN16 is coupled to the second node NB2.

The ninth branch 1517 includes a first capacitor C21, a first diode D1, a second diode D2 and a second capacitor C22 connected in series. The first oscillation control voltage VCON1 is applied to the coupling point of the first diode D1 and the second diode D2.

The width/length values of the transistors may be sequentially increased to be discrete values of $2^k$. For example, when the width/length of each of the NMOS transistors MN11 and MN12 is W/L, the width/length of each of the NMOS transistors MN13 and MN14 may be 2(W/L), and the width/length of each of the NMOS transistors MN15 and MN16 may be $2^7$(W/L).

The voltage-controlled oscillator 1500 shown in FIGS. 4 and 5 includes the capacitor bank 1510. The voltage-controlled oscillator 1500 coarsely controls the capacitance of the ninth branch 1517 in response to the first oscillation control voltage VCON1, and finely controls the capacitance of each of the first branch 1511 to the eighth branch 1515 in response to each bit of the second oscillation control voltage VCON2 having eight bits. The oscillation output signal SOUT of the phase-locked-loop circuit 1000 may be output from the node N11 or the node N12 of the voltage-controlled oscillator shown in FIG. 4.

Figure 6:
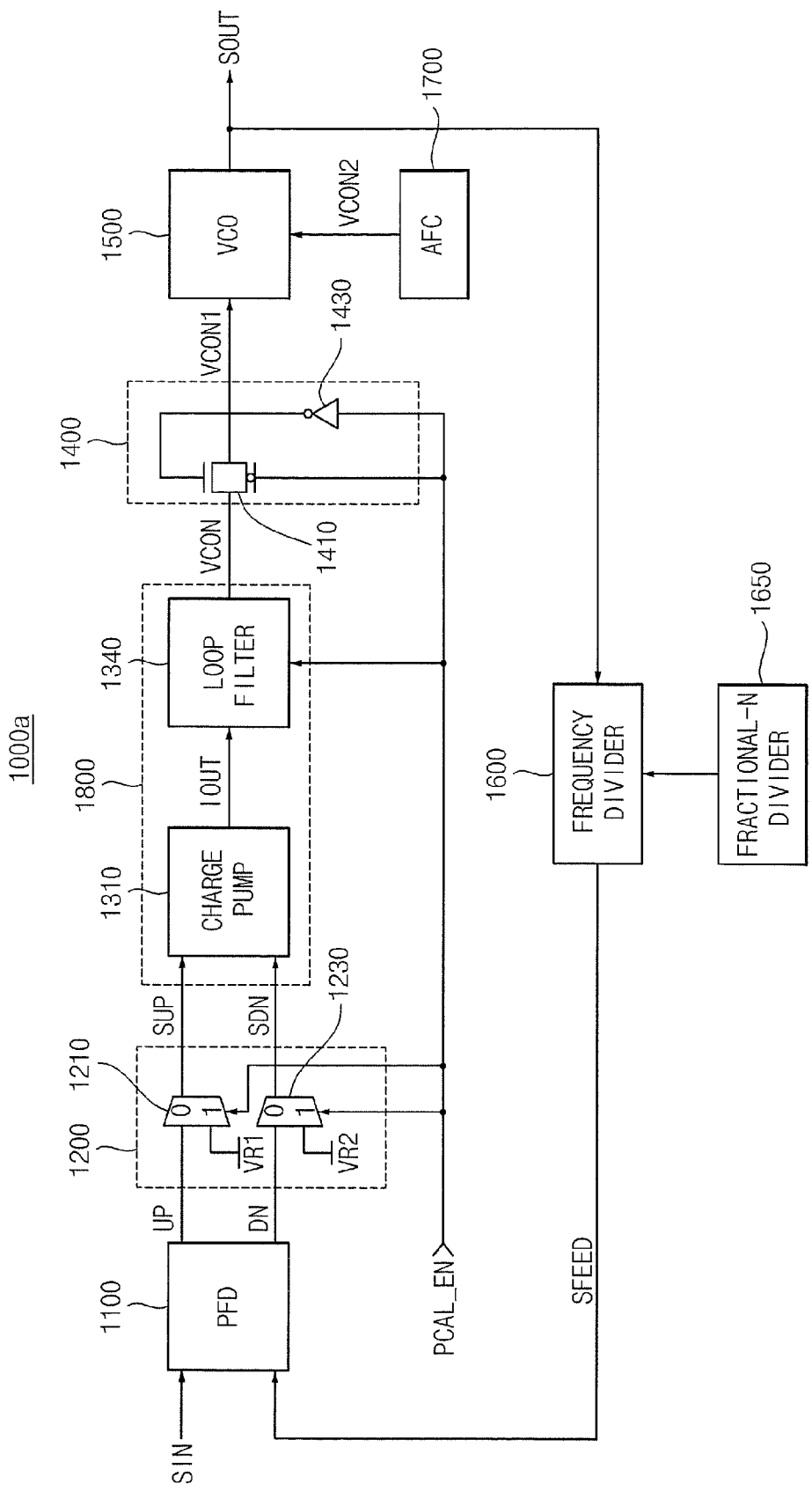
FIG. 6 is a circuit diagram illustrating a phase-locked-loop circuit according to a second example embodiment of the present invention.

FIG. 6 is a circuit diagram illustrating a phase-locked-loop circuit 1000a according to a second example embodiment of the present invention. Referring to FIG. 6, the phase-locked-loop circuit 1000a includes an oscillation control voltage generating circuit, a voltage-controlled oscillator (VCO) 1500, a frequency divider 1600, a fractional frequency divider 1650 and an automatic frequency controller 1700. The oscillation control voltage generating circuit includes a phase/frequency detector (PFD) 1100, a first selection circuit 1200, an oscillation control voltage-generating unit 1800 and a first switch 1400. The oscillation control voltage-generating unit 1800 may include a charge pump 1310 and a loop filter 1340.

The oscillation control voltage generating circuit performs pre-scaling on a pump output current IOUT in a pre-calibration mode to generate a first oscillation control voltage VCON1. The voltage-controlled oscillator 1500 generates an oscillation output signal SOUT that is oscillating with a frequency in response to the first oscillation control voltage VCON1 and a second oscillation control voltage VCON2. The second oscillation control voltage VCON2 is generated by the automatic frequency controller 1700. The frequency divider 1600 divides a frequency of the oscillation output signal SOUT to generate a first feedback signal SFEED, and provides the first feedback signal SFEED to the oscillation control voltage generating circuit. The fractional frequency divider 1650 divides the frequency of the oscillation output signal SOUT with a fractional number by controlling the frequency divider 1600. The fractional frequency divider 1650 may include a delta-sigma modulator (not shown).

In the phase-locked-loop circuit 1000a according to the second example embodiment of the present invention, the structure of the loop filter 1340 included in the oscillation control voltage-generating unit 1800 is different from the loop filter 1330 included in the phase-locked-loop circuit 1000 according to the first example embodiment of the present invention. The oscillation control voltage generating unit 1800 shown in FIG. 6 controls the capacitance of the loop filter 1340 in response to the pre-calibration enable signal PCAL_EN, and integrates the pump output current IOUT to generate a first control voltage VCON.

Figure 7:
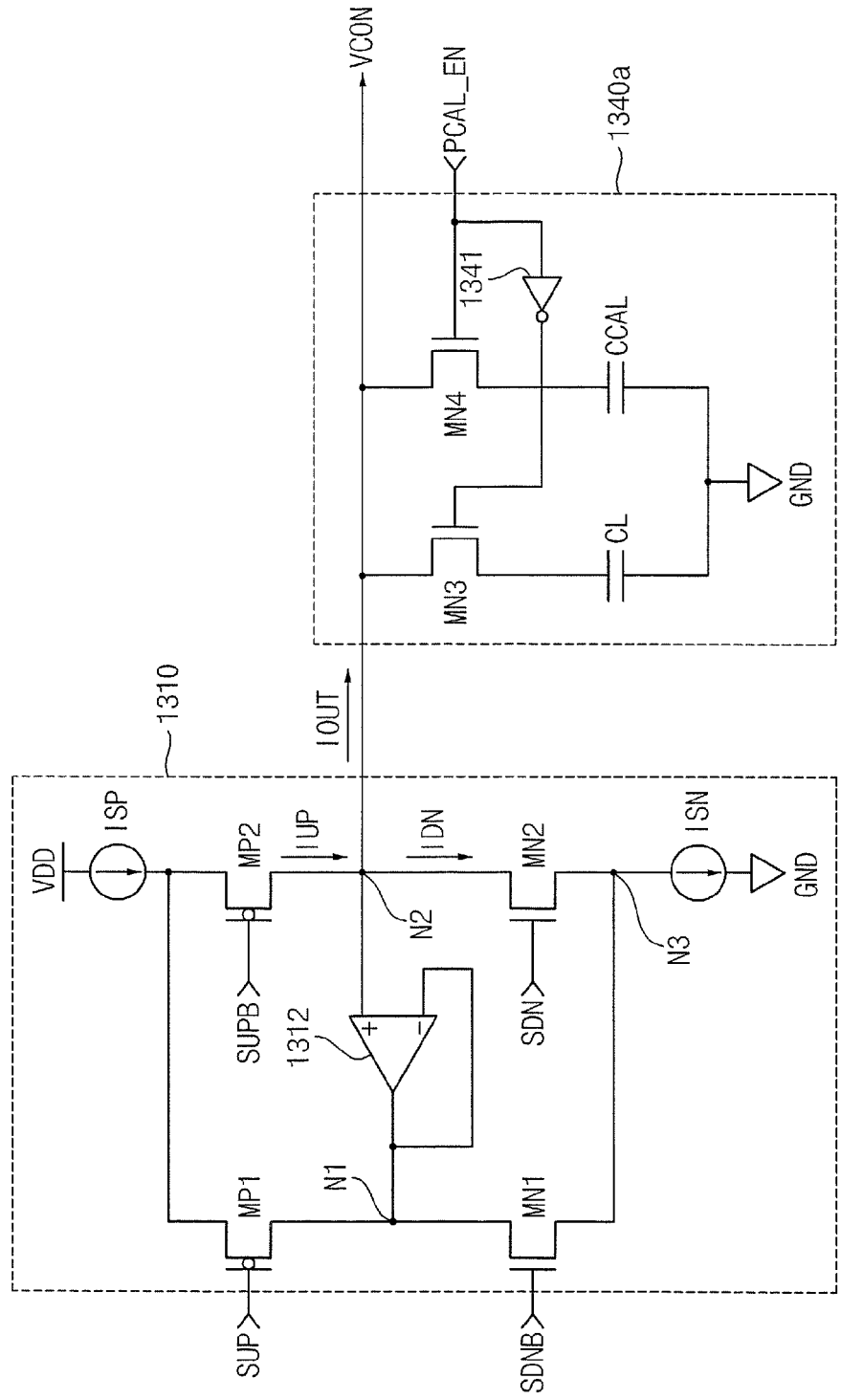
FIG. 7 is a circuit diagram illustrating an example of an oscillation-control-voltage generating circuit that is included in the phase-locked-loop circuit of FIG. 6.

FIG. 7 is a circuit diagram illustrating an example of an oscillation-control-voltage generating circuit 1800 that is included in the phase-locked-loop circuit 1000a of FIG. 6. Referring to FIG. 7, the oscillation-control-voltage generating circuit 1800a includes a charge pump 1310 and a loop filter 1340a. The oscillation-control-voltage generating circuit 1800a outputs the pump output current IOUT to the second node N2, controls the capacitance between the second node N2 and the ground voltage GND, and integrates the pump output current TOUT to generate the first control voltage VCON in response to pre-calibration enable signal PCAL_EN.

The charge pump 1310 generates an up current and a down current in response to the second up signal SUP and the second down signal SDN, and generates the pump output current TOUT corresponding to a magnitude difference between the up current and the down current. The loop filter 1340a controls the capacitance between the second node N2 and the ground voltage GND in response to pre-calibration enable signal PCAL_EN, and integrates the pump output current TOUT to generate the first control voltage VCON. The charge pump 1310 may have the same structure as the charge pump 1310 included in the oscillation-control-voltage generating circuit 1300 shown in FIG. 3.

The loop filter 1340a includes an inverter 1341, a third NMOS transistor MN3, a fourth NMOS transistor MN4, a first capacitor CL and a second capacitor CCAL. The inverter 1341 inverts the pre-calibration enable signal PCAL_EN. The fourth NMOS transistor MN4 has a drain coupled the second node N2, and a gate to which the pre-calibration enable signal PCAL_EN is applied. The third NMOS transistor MN3 has a drain coupled the second node N2, and a gate to which an output signal of the inverter 1341 is applied. The second capacitor CCAL is coupled between a source of the fourth NMOS transistor MN4 and the ground voltage GND. The first capacitor CL is coupled between a source of the third NMOS transistor MN3 and the ground voltage GND. The first control voltage VCON is outputted from the second node N2.

Hereinafter, the operation of the oscillation-control-voltage generating circuit 1800a shown in FIG. 7 will be described. In the pre-calibration mode, the pre-calibration enable signal PCAL_EN is enabled, the fourth NMOS transistor MN4 is turned on, and the third NMOS transistor MN3 is turned off. Further, the second capacitor CCAL is electrically coupled to the second node N2, and the first capacitor CL is electrically decoupled from the second node N2 in the pre-calibration mode. In the normal mode, the pre-calibration enable signal PCAL_EN is disabled, the fourth NMOS transistor MN4 is turned off, and the third NMOS transistor MN3 is turned on. Further, the first capacitor CL is electrically coupled to the second node N2, and the second capacitor CCAL is electrically decoupled from the second node N2 in the normal mode. In the example of FIG. 7, the second capacitor CCAL is used for pre-calibration, and the first capacitor CL is used for integrating the pump output current IOUT in the normal mode. Therefore, the capacitance of the second capacitor CCAL may be less than the capacitance of the first capacitor CL for decreasing a time to perform pre-calibration.

Figure 8:
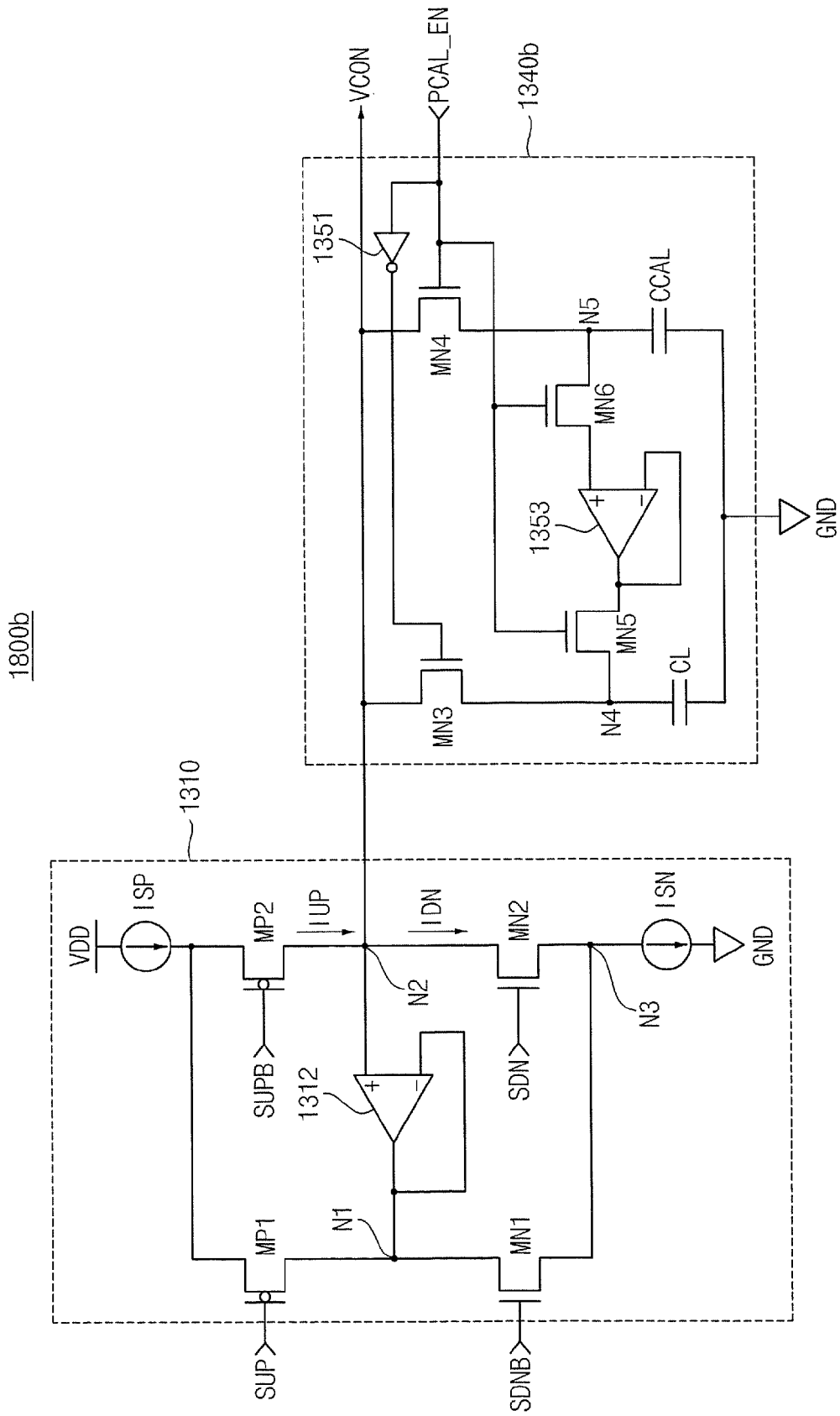
FIG. 8 is a circuit diagram illustrating another example of an oscillation-control-voltage generating circuit that is included in the phase-locked-loop circuit of FIG. 6.

FIG. 8 is a circuit diagram illustrating another example of an oscillation-control-voltage generating circuit 1800 that is included in the phase-locked-loop circuit 1000a of FIG. 6. Referring to FIG. 8, the oscillation-control-voltage generating circuit 1800b includes a charge pump 1310 and a loop filter 1340b. The oscillation-control-voltage generating circuit 1800b outputs the pump output current IOUT to the second node N2, controls the capacitance between the second node N2 and the ground voltage GND, and integrates the pump output current IOUT to generate the first control voltage VCON in response to pre-calibration enable signal PCAL_EN.

The charge pump 1310 generates an up current and a down current in response to the second up signal SUP and the second down signal SDN, and generates the pump output current IOUT corresponding to a magnitude difference between the up current and the down current. The loop filter 1340b controls the capacitance between the second node N2 and the ground voltage GND in response to pre-calibration enable signal PCAL_EN, and integrates the pump output current IOUT to generate the first control voltage VCON.

The charge pump 1310 may have the same structure as the charge pump 1310 included in the oscillation-control-voltage generating circuit 1300 shown in FIG. 3. The loop filter 1340b includes an inverter 1351, a third NMOS transistor MN3, a fourth NMOS transistor MN4, a first capacitor CL and a second capacitor CCAL, a fifth NMOS transistor MN5, a sixth NMOS transistor MN6 and a unit gain amplifier 1353. The inverter 1351 inverts the pre-calibration enable signal PCAL_EN. The fourth NMOS transistor MN4 has a drain coupled the second node N2, a gate to which the pre-calibration enable signal PCAL_EN is applied, and a source coupled to a fifth node N5. The third NMOS transistor MN3 has a drain coupled the second node N2, a gate to which an output signal of the inverter 1351 is applied, and a source coupled to the fourth node N4. The second capacitor CCAL is coupled between a source of the fourth NMOS transistor MN4 and the ground voltage GND. The first capacitor CL is coupled between a source of the third NMOS transistor MN3 and the ground voltage GND. The fifth NMOS transistor MN5 has a first terminal coupled to the fourth node N4, and controlled by the pre-calibration enable signal PCAL_EN. The sixth NMOS transistor MN6 has a first terminal coupled to the fifth node N5, and controlled by the pre-calibration enable signal PCAL_EN. The unit gain amplifier 1353 is coupled between a second terminal of the fifth NMOS transistor MN5 and a second terminal of the sixth NMOS transistor MN6. The first control voltage VCON is outputted from the second node N2.

Hereinafter, the operation of the oscillation-control-voltage generating circuit 1800b shown in FIG. 8 will be described. In the pre-calibration mode, the pre-calibration enable signal PCAL_EN is enabled, the fourth NMOS transistor MN4 is turned on, and the third NMOS transistor MN3 is turned off. Further, the second capacitor CCAL is electrically coupled to the second node N2, and the first capacitor CL is electrically decoupled from the second node N2 in the pre-calibration mode. Further, the fifth NMOS transistor MN5 and the sixth NMOS transistor MN6 are turned on, and charging current flows from the fifth node N5 to the fourth node N4 to charge the first capacitor CL. In the normal mode, the pre-calibration enable signal PCAL_EN is disabled, the fourth NMOS transistor MN4 is turned off, and the third NMOS transistor MN3 is turned on. Further, the first capacitor CL is electrically coupled to the second node N2, and the second capacitor CCAL is electrically decoupled from the second node N2 in the normal mode.

In the example of FIG. 8, the second capacitor CCAL is used for pre-calibration, and the first capacitor CL is used for integrating the pump output current IOUT in the normal mode. Therefore, the capacitance of the second capacitor CCAL may be less than the capacitance of the first capacitor CL for decreasing a time to perform pre-calibration. In the loop filter 1340b shown in FIG. 8, the first capacitor CL is also charged in the pre-calibration mode. Therefore, a time to charge the first capacitor CL in the normal mode may be decreased.

Figure 9:
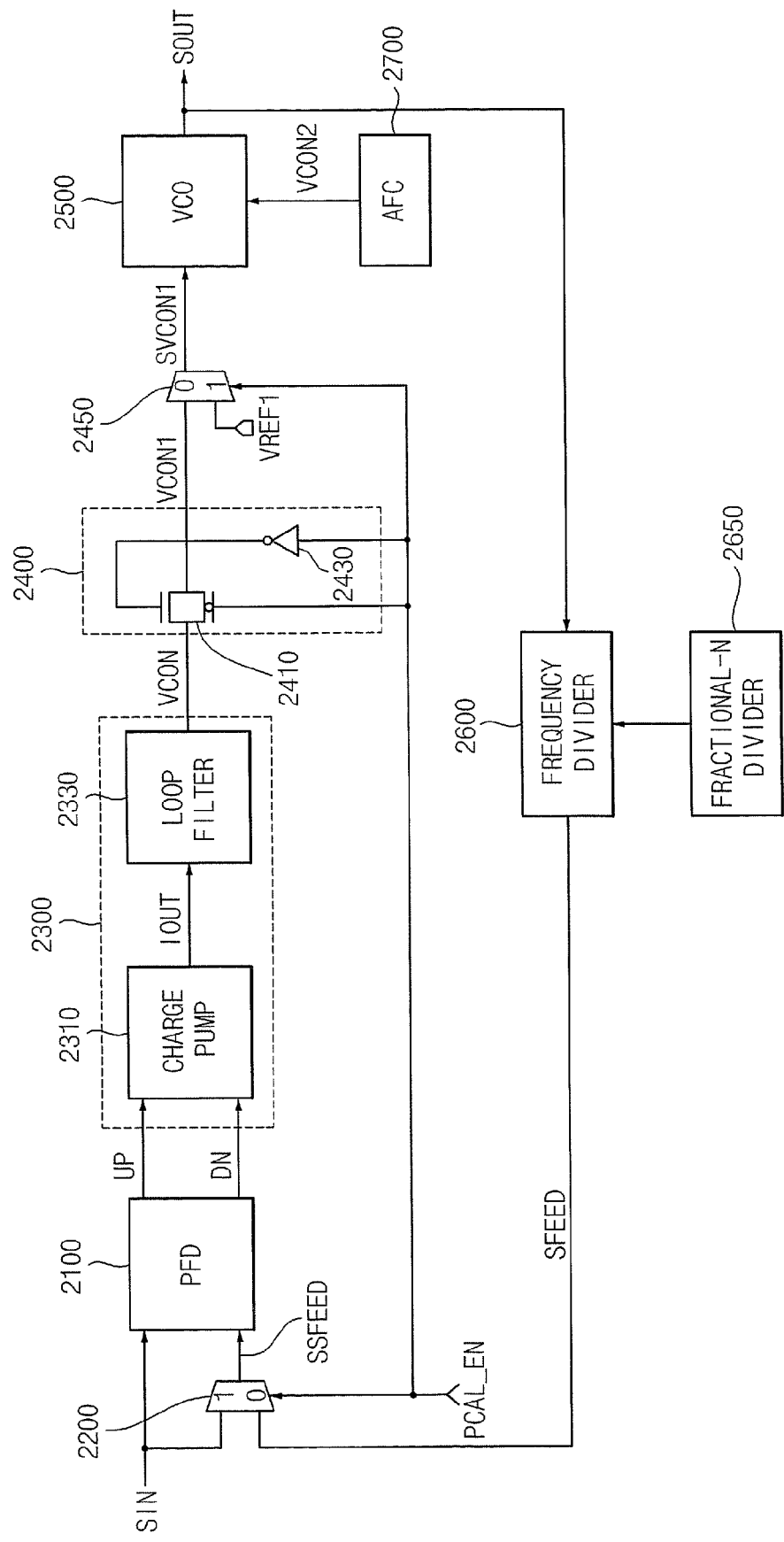
FIG. 9 is a circuit diagram illustrating a phase-locked-loop circuit according to a third example embodiment of the present invention.

FIG. 9 is a circuit diagram illustrating a phase-locked-loop circuit 2000 according to a third example embodiment of the present invention. Referring to FIG. 9, the phase-locked-loop circuit 2000 includes an oscillation control voltage generating circuit, a voltage-controlled oscillator (VCO) 2500, a frequency divider 2600, a fractional frequency divider 2650 and an automatic frequency controller 2700. The oscillation control voltage generating circuit includes a first selection circuit 2200, a phase/frequency detector (PFD) 2100, an oscillation control voltage-generating unit 2300, a first switch 2400 and a second selection circuit 2450. The oscillation control voltage-generating unit 2300 may include a charge pump 2310 and a loop filter 2330.

The oscillation control voltage generating circuit performs pre-scaling on a pump output current IOUT in a pre-calibration mode to generate a first oscillation control voltage SVCON1. The voltage-controlled oscillator 2500 generates an oscillation output signal SOUT that is oscillating with a frequency in response to the first oscillation control voltage SVCON1 and a second oscillation control voltage VCON2. The second oscillation control voltage VCON2 is generated by the automatic frequency controller 2700. The frequency divider 2600 divides a frequency of the oscillation output signal SOUT to generate a first feedback signal SFEED, and provides the first feedback signal SFEED to the oscillation control voltage generating circuit. The fractional frequency divider 2650 divides the frequency of the oscillation output signal SOUT with a fractional number by controlling the frequency divider 2600. The fractional frequency divider 2650 may include a delta-sigma modulator (not shown).

The first selection circuit 2200 performs multiplexing on the input signal SIN and the first feedback signal SFEED to generate a second feedback signal SSFEED in response to a pre-calibration enable signal PCAL_EN. The phase/frequency detector (PFD) 2100 generates a first up signal UP and a first down signal DN corresponding to a phase difference between an input signal SIN and the second feedback signal SSFEED.

The oscillation control voltage generating unit 2300 generates the pump output current IOUT based on the first up signal UP and the first down signal DN, and integrates the pump output current IOUT to generate a first control voltage VCON. The charge pump 2310 generates an up current and a down current in response to the first up signal UP and the first down signal DN, and generates the pump output current IOUT corresponding to a magnitude difference between the up current and the down current. The loop filter 2330 integrates the pump output current IOUT to generate the first control voltage VCON.

The first switch 2400 outputs the second control voltage VCON1 corresponding to the first control voltage VCON in response to the pre-calibration enable signal PCAL_EN. The first switch 2400 may include a transmission gate 2410 and an inverter 2430. The second selection circuit 2450 performs multiplexing on the second control voltage VCON1 and a third reference voltage VREF1 to generate the first oscillation control voltage SVCON1 in response to a pre-calibration enable signal PCAL_EN.

Hereinafter, the operation of the phase-locked-loop circuit 2000 of FIG. 9 will be described. The phase-locked-loop circuit 2000 of FIG. 9 operates in a pre-calibration mode and in a normal mode. In the phase-locked-loop circuit 2000 of FIG. 9, the phase/frequency detector 2100 and the voltage-controlled oscillator (VCO) 2500 may operate in addition to the oscillation control voltage generating unit 2300 in the pre-calibration mode, unlike the phase-locked-loop circuit 1000 of FIG. 2.

In the pre-calibration mode, the pre-calibration enable signal PCAL_EN is enabled. When the pre-calibration enable signal PCAL_EN is logic "high" state, the first selection circuit 2200 outputs the input signal SIN as the second feedback signal SSFEED. Further, when the pre-calibration enable signal PCAL_EN is logic "high" state, the first switch 2400 is turned off, and the oscillation control voltage-generating unit 2300 is electrically decoupled from the voltage-controlled oscillator 2500. Further, when the pre-calibration enable signal PCAL_EN is logic "high" state, the second selection circuit 2450 outputs the third reference voltage VREF1 as the first oscillation control voltage SVCON1. The third reference voltage VREF1 may be the power supply voltage VDD or the ground voltage GND.

In the pre-calibration mode, the phase/frequency detector 2100 operates as if the phase/frequency detector 2100 is in the lock condition because the input signal SIN is applied to two input terminals of the phase/frequency detector 2100. In this condition, the first control voltage VCON, which is an output signal of the oscillation control voltage-generating unit 2300, maintains a constant value theoretically. However, when mismatch is generated between the up current and the down current owing to a process variation or a temperature variation, the magnitude of the up current and the magnitude of the down current may not be equal. As described above referring to FIG. 3, when the pre-calibration operation is completed, the magnitude of the up current and the down current becomes equal, and the magnitude of the pump output current TOUT becomes zero. Then, the first control voltage VCON has a constant value.

When the pre-calibration operation is completed, the phase-locked-loop circuit 2000 operates in the normal mode. In the normal mode, the pre-calibration enable signal PCAL_EN is disabled. When the pre-calibration enable signal PCAL_EN has logic "low" state, the first selection circuit 2200 outputs a first feedback signal SFEED as a second feedback signal SSFEED. Further, when the pre-calibration enable signal PCAL_EN has logic "low" state, the first switch 2400 is turned on, and the oscillation control voltage-generating unit 2300 is electrically coupled to the voltage-controlled oscillator 2500. Further, as the pre-calibration enable signal PCAL_EN has logic "low" state, the second selection circuit 2450 outputs the second control voltage VCON1 corresponding to the first control voltage VCON as the first oscillation control voltage SVCON1.

In the normal mode, the phase-locked-loop circuit 2000 compares a phase and frequency of the input signal SIN and the first feedback signal SFEED. The phase-locked-loop circuit 2000 outputs the oscillation output signal SOUT that is synchronized with the input signal SIN and having a frequency of integer times or fractional times of the input signal SIN.

Therefore, the phase-locked-loop circuit 2000 of FIG. 9 maintains the magnitude of the up current and the down current equal, and performs pre-calibration before entering the normal mode to maintain the pump output current TOUT zero. When synchronizing between the input signal SIN and the first feedback signal SFEED is performed by the phase-locked-loop circuit 2000 after the pre-calibration operation is completed, the amount of noise that may be included in the oscillation output signal SOUT may be decreased.

Figure 10:
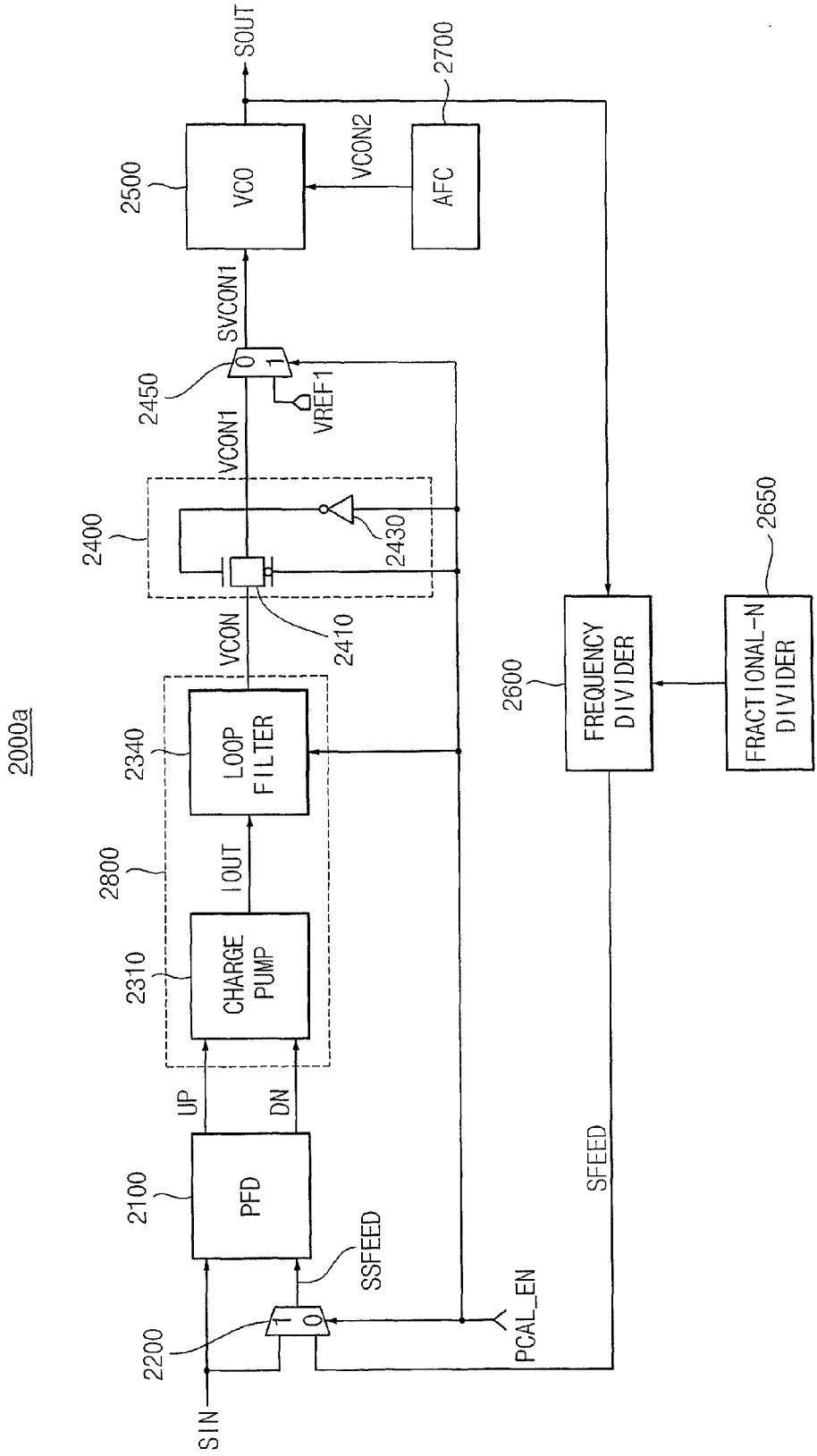
FIG. 10 is a circuit diagram illustrating a phase-locked-loop circuit according to a fourth example embodiment of the present invention.

FIG. 10 is a circuit diagram illustrating a phase-locked-loop circuit 2000a according to a fourth example embodiment of the present invention. In the phase-locked-loop circuit 2000a according to the fourth example embodiment of the present invention, the structure of the loop filter 2340 included in the oscillation control voltage-generating unit 2800 is different from the loop filter 2330 included in the phase-locked-loop circuit 2000 according to the third example embodiment of the present invention. The oscillation control voltage generating unit 2800 shown in FIG. 10 controls the capacitance of the loop filter 2340 in response to the pre-calibration enable signal PCAL_EN, and integrates the pump output current IOUT to generate a first control voltage VCON.

Figure 11:
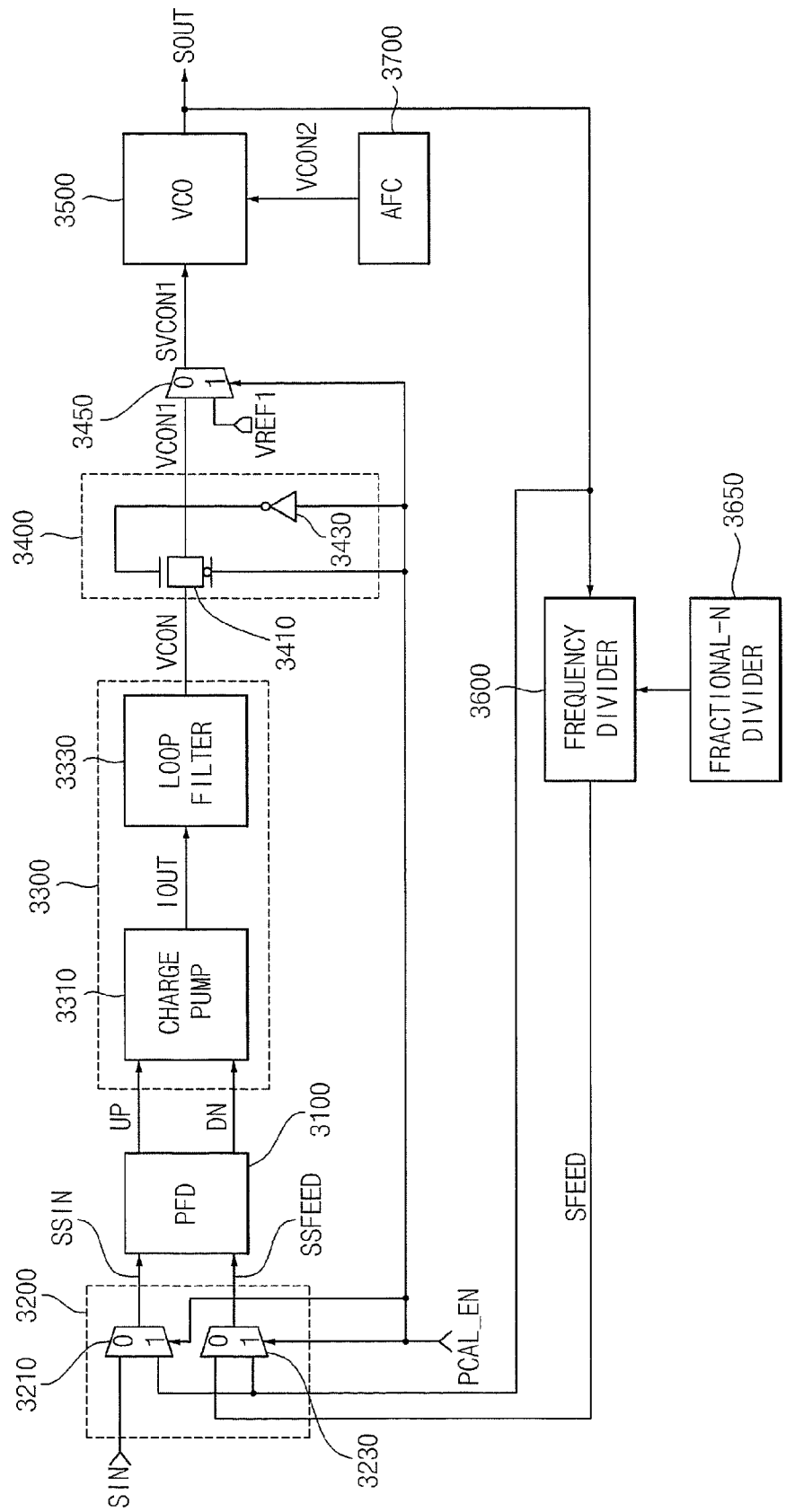
FIG. 11 is a circuit diagram illustrating a phase-locked-loop circuit according to a fifth example embodiment of the present invention.

FIG. 11 is a circuit diagram illustrating a phase-locked-loop circuit 3000 according to a fifth example embodiment of the present invention. Referring to FIG. 11, the phase-locked-loop circuit 3000 includes an oscillation control voltage generating circuit, a voltage-controlled oscillator (VCO) 3500, a frequency divider 3600, a fractional frequency divider 3650 and an automatic frequency controller 3700. The oscillation control voltage generating circuit includes a first selection circuit 3200, a phase/frequency detector (PFD) 3100, an oscillation control voltage-generating unit 3300, a first switch 3400 and a second selection circuit 3450. The oscillation control voltage-generating unit 3300 may include a charge pump 3310 and a loop filter 3330.

The first selection circuit 3200 performs multiplexing on the input signal SIN and the oscillation output signal SOUT to generate a first selection signal SSIN, and performs multiplexing on the input signal SIN and the first feedback signal SFEED to generate a second feedback signal SSFEED in response to a pre-calibration enable signal PCAL_EN. The phase/frequency detector (PFD) 3100 generates a first up signal UP and a first down signal DN corresponding to a phase difference between a first selection signal SSIN and the second feedback signal SSFEED. The oscillation control voltage generating unit 3300 generates the pump output current IOUT based on the first up signal UP and the first down signal DN, and integrates the pump output current IOUT to generate a first control voltage VCON. The charge pump 3310 generates an up current and a down current in response to the first up signal UP and the first down signal DN, and generates the pump output current TOUT corresponding to a magnitude difference between the up current and the down current. The loop filter 3330 integrates the pump output current TOUT to generate the first control voltage VCON. The first switch 3400 outputs the second control voltage VCON1 corresponding to the first control voltage VCON in response to the pre-calibration enable signal PCAL_EN. The first switch 3400 may include a transmission gate 3410 and an inverter 3430. The second selection circuit 3450 performs multiplexing on the second control voltage VCON1 and a third reference voltage VREF1 to generate the first oscillation control voltage SVCON1 in response to a pre-calibration enable signal PCAL_EN.

The phase-locked-loop circuit 3000 according to a fifth example embodiment of the present invention shown in FIG. 11 is different from the phase-locked-loop circuit 3000 according to a third example embodiment of the present invention shown in FIG. 9. But, the operation of the phase-locked-loop circuit 3000 of FIG. 11 is similar to the operation of the phase-locked-loop circuit 2000 of FIG. 9. Therefore, further description of the operation of the phase-locked-loop circuit 3000 will be omitted.

Figure 12:
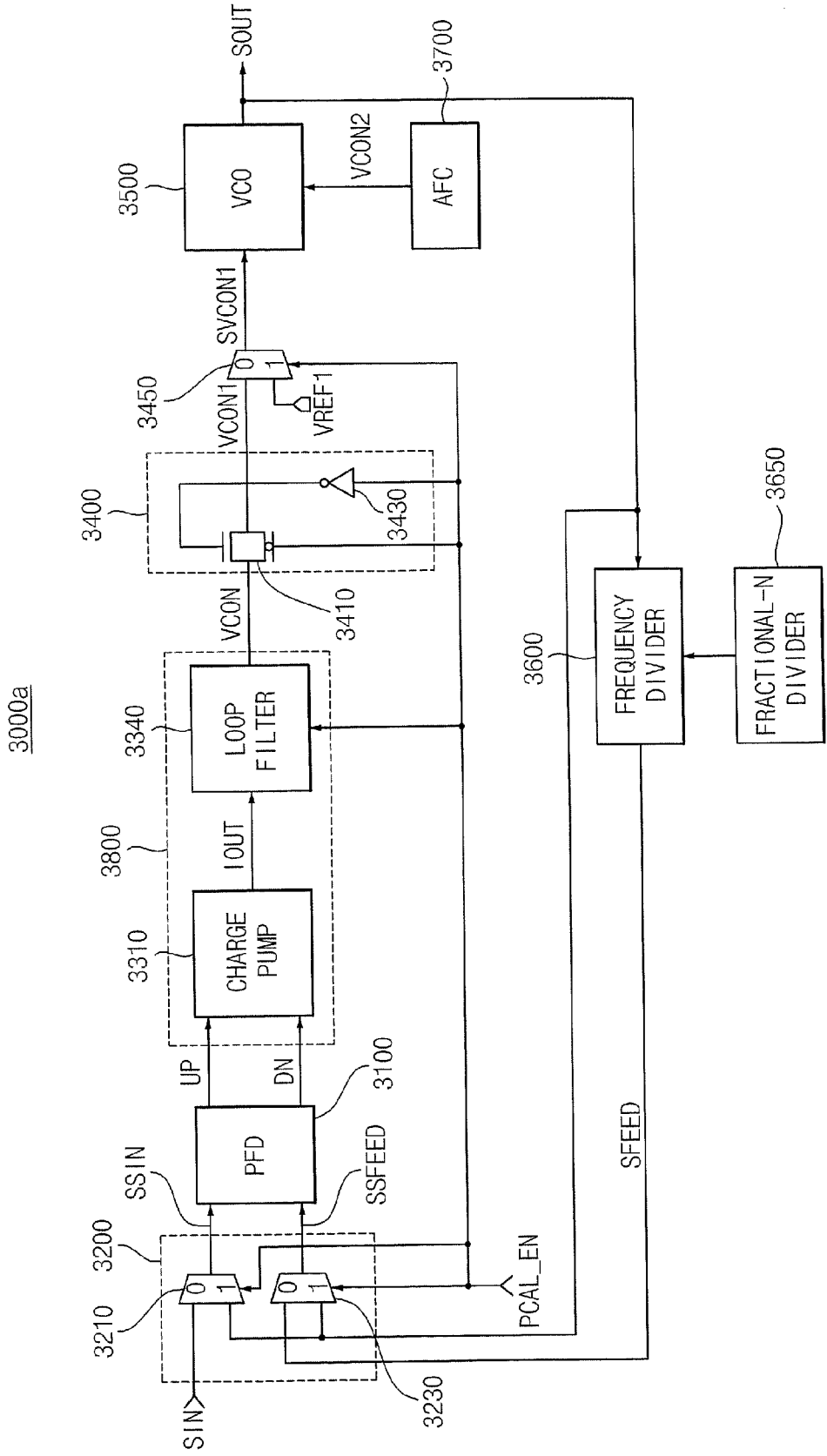
FIG. 12 is a circuit diagram illustrating a phase-locked-loop circuit according to a sixth example embodiment of the present invention.

FIG. 12 is a circuit diagram illustrating a phase-locked-loop circuit 3000a according to a sixth example embodiment of the present invention, which is similar to the fifth embodiment of FIG. 11. In the phase-locked-loop circuit 3000a according to the sixth example embodiment of the present invention, the structure of the loop filter 3340 included in the oscillation control voltage-generating unit 3800 is different from the loop filter 3330 included in the phase-locked-loop circuit 3000 according to the fifth example embodiment of the present invention. The oscillation control voltage generating unit 3800 shown in FIG. 12 controls the capacitance of the loop filter 3340 in response to the pre-calibration enable signal PCAL_EN, and integrates the pump output current TOUT to generate a first control voltage VCON.

Figure 13:
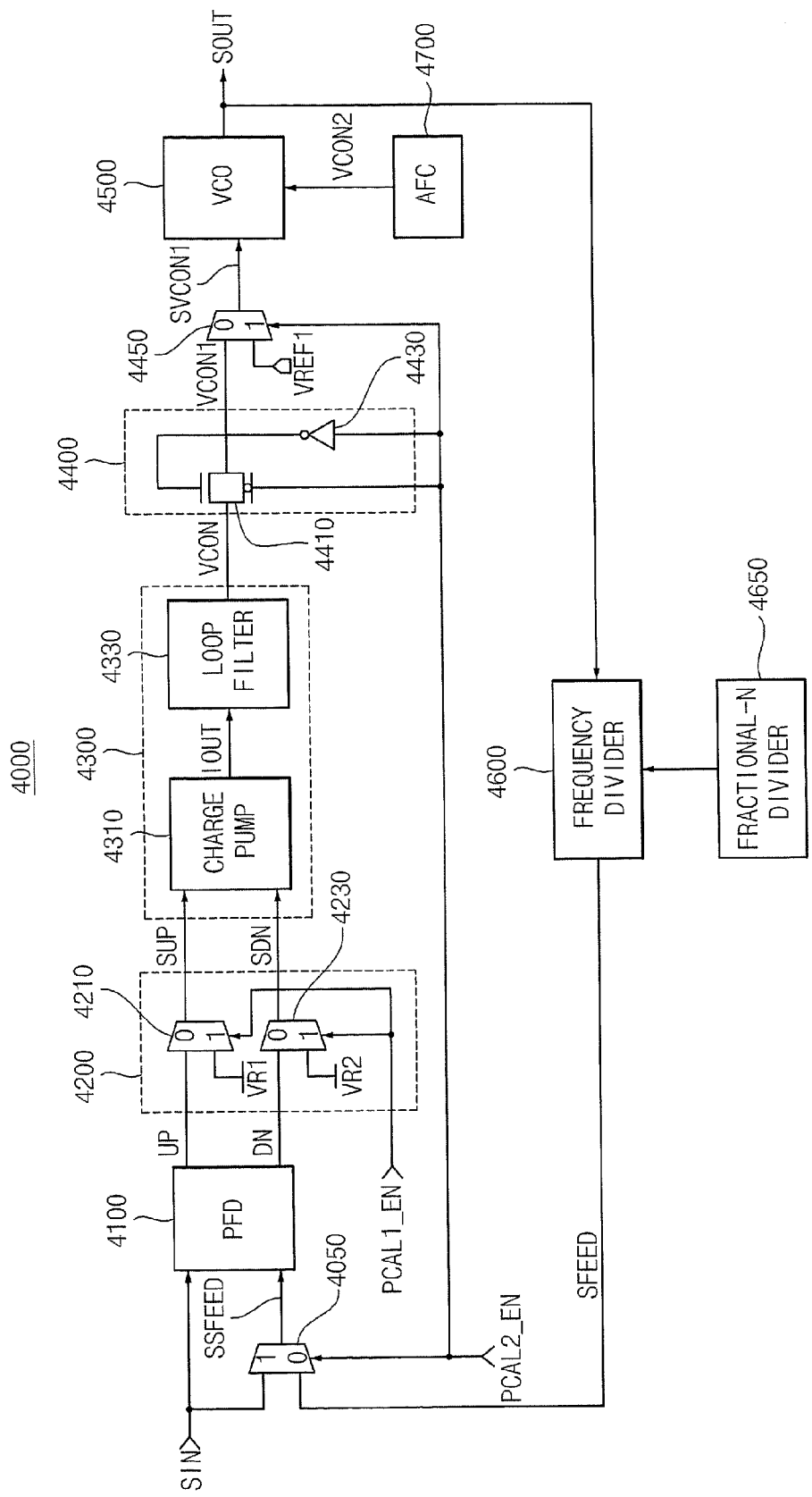
FIG. 13 is a circuit diagram illustrating a phase-locked-loop circuit according to a seventh example embodiment of the present invention.

FIG. 13 is a circuit diagram illustrating a phase-locked-loop circuit 4000 according to a seventh example embodiment of the present invention. Referring to FIG. 13, the phase-locked-loop circuit 4000 includes an oscillation control voltage generating circuit, a voltage-controlled oscillator (VCO) 4500, a frequency divider 4600, a fractional frequency divider 4650 and an automatic frequency controller 4700. The oscillation control voltage generating circuit includes a first selection circuit 4050, a phase/frequency detector (PFD) 4100, a second selection circuit 4200, an oscillation control voltage generating unit 4300, a first switch 4400, and a third selection circuit 4450. The oscillation control voltage-generating unit 4300 may include a charge pump 4310 and a loop filter 4330.

The oscillation control voltage generating circuit performs pre-scaling on a pump output current IOUT in a pre-calibration mode to generate a first oscillation control voltage SVCON1. The voltage-controlled oscillator 4500 generates an oscillation output signal SOUT that is oscillating with a frequency in response to the first oscillation control voltage SVCON1 and a second oscillation control voltage VCON2 in a normal mode. The second oscillation control voltage VCON2 is generated by the automatic frequency controller 4700. The frequency divider 4600 divides a frequency of the oscillation output signal SOUT to generate a first feedback signal SFEED in the normal mode, and provides the first feedback signal SFEED to the oscillation control voltage generating circuit. The fractional frequency divider 4650 divides the frequency of the oscillation output signal SOUT with a fractional number by controlling the frequency divider 4600. The fractional frequency divider 4650 may include a delta-sigma modulator (not shown).

The first selection circuit 4050 performs multiplexing on the input signal SIN and the first feedback signal SFEED to generate a second feedback signal SSFEED in response to a pre-calibration enable signal PCAL_EN. The phase/frequency detector (PFD) 4100 generates a first up signal UP and a first down signal DN corresponding to a phase difference between an input signal SIN and the second feedback signal SSFEED.

The second selection circuit 4200 multiplexes the first up signal UP and a first reference voltage VR1 to generate a second up signal SUP and multiplexes the first down signal DN and a second reference voltage VR2 to generate a second down signal SDN in response to a pre-calibration enable signal PCAL_EN. The first selection circuit 4200 may include multiplexers 4210 and 4230. The oscillation control voltage generating unit 4300 generates the pump output current IOUT based on the second up signal SUP and the second down signal SDN, and integrates the pump output current IOUT to generate a first control voltage VCON.

The charge pump 4310 generates an up current and a down current in response to the second up signal SUP and the second down signal SDN, and generates the pump output current IOUT corresponding to a magnitude difference between the up current and the down current in response to the second up signal SUP and the second down signal SDN. The loop filter 4330 integrates the pump output current IOUT to generate the first control voltage VCON. The first switch 4400 outputs the second control voltage VCON1 corresponding to the first control voltage VCON in response to the pre-calibration enable signal PCAL_EN. The first switch 4400 may include a transmission gate 4410 and an inverter 4430. The third selection circuit 4450 performs multiplexing on the second control voltage VCON1 and a third reference voltage VREF1 to generate the first oscillation control voltage SVCON1 in response to a pre-calibration enable signal PCAL_EN.

Hereinafter, the operation of the phase-locked-loop circuit 4000 of FIG. 13 will be described. The phase-locked-loop circuit 4000 of FIG. 13 has a mixed structure of the phase-locked-loop circuit 1000 of FIG. 2 and the phase-locked-loop circuit 2000 of FIG. 9. The phase-locked-loop circuit of FIG. 13 operates in a first pre-calibration mode, in a second pre-calibration mode and in a normal mode.

In the first pre-calibration mode, the phase-locked-loop circuit 4000 of FIG. 13 operates as follows. In the first pre-calibration mode, the first pre-calibration enable signal PCAL1_EN and the second pre-calibration enable signal PCAL2_EN are enabled. When the first pre-calibration enable signal PCAL1_EN is logic "high" state, the second selection circuit 4200 outputs the first reference voltage VR1 as the second up signal SUP and the second reference voltage VR2 as the second down signal SDN. Further, when the first pre-calibration enable signal PCAL1_EN is logic "high" state, the first switch 4400 is turned off, and the oscillation control voltage generating unit 4300 is electrically decoupled from the voltage-controlled oscillator 4500. In this condition, the oscillation control voltage-generating unit 4300 performs a pre-calibration operation. The first reference voltage VR1, which is applied to the second selection circuit 4200, may have logic "high" state and the second reference voltage VR2 may have logic "high" state. The first reference voltage may be a power supply voltage VDD and the second reference voltage may be a power supply voltage.

When the first pre-calibration operation is completed, the phase-locked-loop circuit 4000 performs the second pre-calibration operation. In the second pre-calibration mode, the phase-locked-loop circuit 4000 of FIG. 13 operates as follows. In the second pre-calibration mode, the first pre-calibration enable signal PCAL1_EN is disabled and the second pre-calibration enable signal PCAL2_EN is enabled. Therefore, the phase/frequency detector 4100 and the voltage-controlled oscillator (VCO) 4500 may operate in addition to the oscillation control voltage-generating unit 4300 in the pre-calibration mode.

In the second pre-calibration mode, when the second pre-calibration enable signal PCAL2_EN is logic "high" state, the first selection circuit 4050 outputs the input signal SIN as the second feedback signal SSFEED. Further, when the second pre-calibration enable signal PCAL2_EN is logic "high" state, the first switch 4400 is turned off, and the oscillation control voltage generating unit 4300 is electrically decoupled from the voltage-controlled oscillator 4500. Further, when the second pre-calibration enable signal PCAL2_EN is logic "high" state, the third selection circuit 4450 outputs the third reference voltage VREF1 as the first oscillation control voltage SVCON1. The third reference voltage may be a power supply voltage VDD or a ground voltage GND.

In the second pre-calibration mode, the phase/frequency detector 4100 operates as if the phase/frequency detector 4100 is in the lock condition because the input signal SIN is applied to two input terminals of the phase/frequency detector 4100. In this condition, the first control voltage VCON, which is an output signal of the oscillation control voltage-generating unit 4300, maintains a constant value theoretically. However, when mismatch is generated between the up current and the down current owing to a process variation or a temperature variation, the magnitude of the up current and the magnitude of the down current may not be equal. As described above referring to FIG. 3, when the pre-calibration operation is completed, the magnitude of the up current and the down current becomes equal, and the magnitude of the pump output current IOUT becomes zero. Then, the first control voltage VCON has a constant value.

When the first pre-calibration operation and the second pre-calibration operation are completed, the phase-locked-loop circuit 4000 operates in the normal mode. In the normal mode, the first pre-calibration enable signal PCAL1_EN and the second pre-calibration enable signal PCAL2_EN are disabled. When the second pre-calibration enable signal PCAL2_EN has logic "low" state, the first selection circuit 4050 outputs the first feedback signal SFEED as the second feedback signal SSFEED. Further, when the second pre-calibration enable signal PCAL2_EN is logic "low" state, the first switch 4400 is turned on, and the oscillation control voltage generating unit 4300 is electrically coupled to the voltage-controlled oscillator 4500. Further, the first switch 4400 outputs the first control voltage VCON as the second control voltage VCON1.

As the first pre-calibration enable signal PCAL1_EN is logic "low" state, the second selection circuit 4200 outputs the first up signal UP as the second up signal SUP, and outputs the first down signal DN as the second down signal SDN. Further, as the second pre-calibration enable signal PCAL2_EN has logic "low" state, the third selection circuit 4450 outputs the second control voltage VCON1 corresponding to the first control voltage VCON as the first oscillation control voltage SVCON1.

In the normal mode, the phase-locked-loop circuit 4000 of FIG. 13 maintains the magnitude of the up current and the down current equal, and performs pre-calibration through the first pre-calibration mode and the second pre-calibration mode before entering the normal mode to maintain the pump output current IOUT zero. When synchronizing between the input signal SIN and the first feedback signal SFEED is performed by the phase-locked-loop circuit 4000 after the pre-calibration operation is completed, the amount of noise that may be included in the oscillation output signal SOUT may be decreased.

Figure 14:
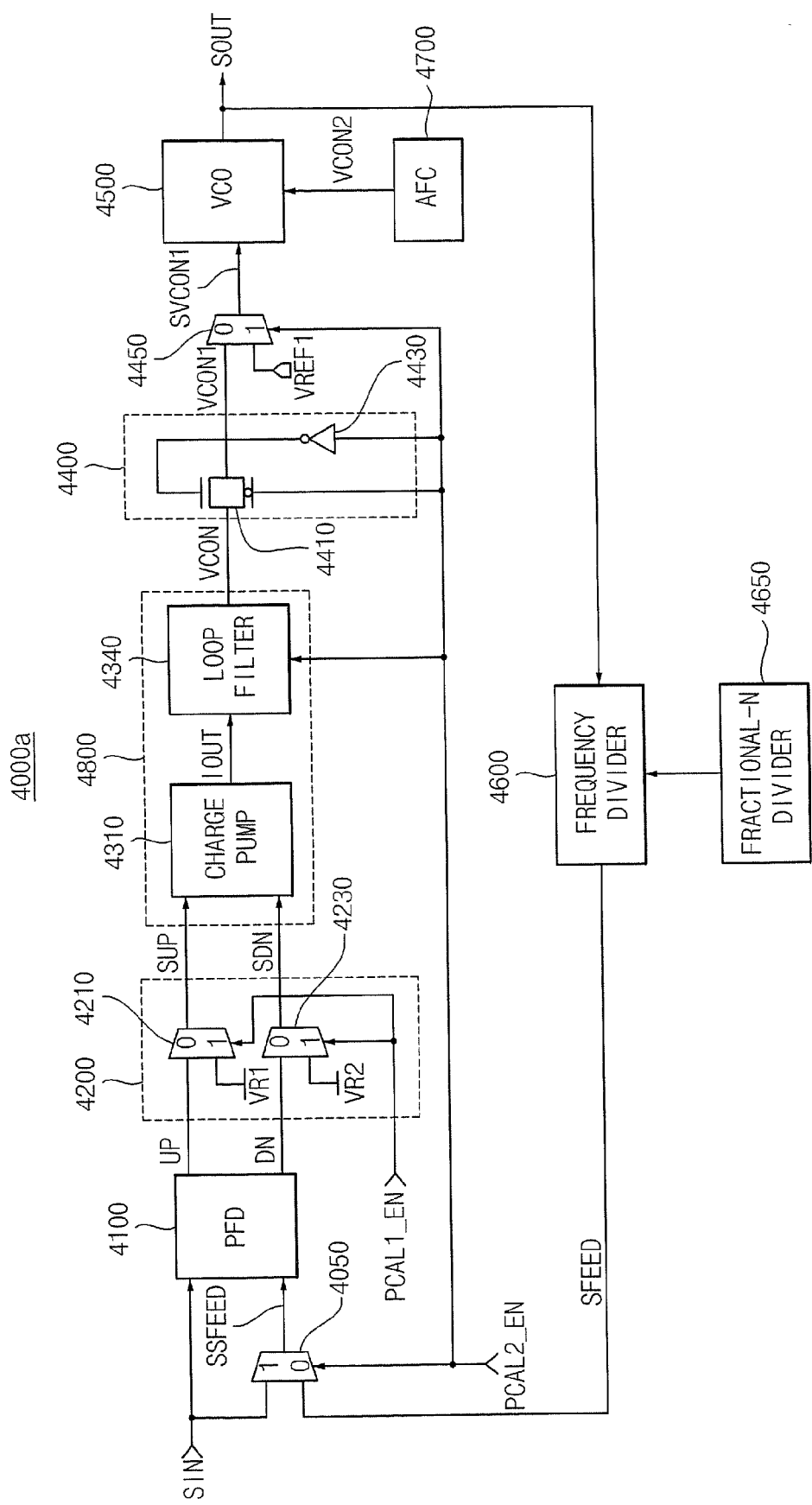
FIG. 14 is a circuit diagram illustrating a phase-locked-loop circuit according to an eighth example embodiment of the present invention.

FIG. 14 is a circuit diagram illustrating a phase-locked-loop circuit 4000a according to an eighth example embodiment of the present invention. In the phase-locked-loop circuit 4000a according to the eighth example embodiment of the present invention, the structure of the loop filter 4340 included in the oscillation control voltage-generating unit 4800 is different from the loop filter 4330 included in the phase-locked-loop circuit 4000 according to the seventh example embodiment of the present invention. The oscillation control voltage generating unit 4800 shown in FIG. 14 controls the capacitance of the loop filter 4340 in response to the pre-calibration enable signal PCAL_EN, and integrates the pump output current IOUT to generate a first control voltage VCON.

Figure 15:
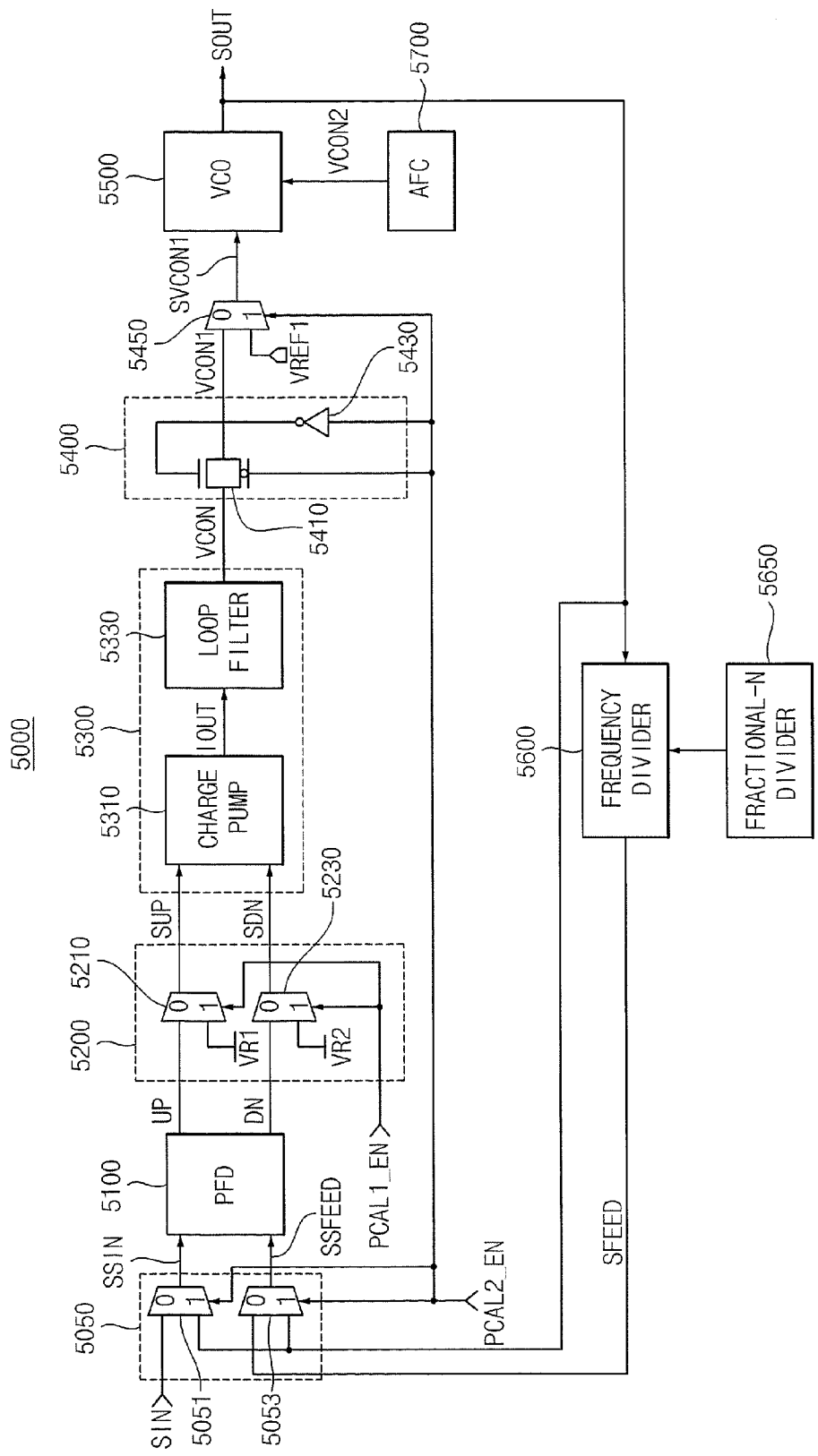
FIG. 15 is a circuit diagram illustrating a phase-locked-loop circuit according to a ninth example embodiment of the present invention.

FIG. 15 is a circuit diagram illustrating a phase-locked-loop circuit 5000 according to a ninth example embodiment of the present invention. Referring to FIG. 15, the phase-locked-loop circuit 5000 includes an oscillation control voltage generating circuit, a voltage-controlled oscillator (VCO) 5500, a frequency divider 5600, a fractional frequency divider 5650 and an automatic frequency controller 5700. The oscillation control voltage generating circuit includes a first selection circuit 5050, a phase/frequency detector (PFD) 5100, a second selection circuit 5200, an oscillation control voltage generating unit 5300, a first switch 5400, and a third selection circuit 5450. The oscillation control voltage-generating unit 5300 may include a charge pump 5310 and a loop filter 5330.

The oscillation control voltage generating circuit performs pre-scaling on a pump output current IOUT in a pre-calibration mode to generate a first oscillation control voltage SVCON1. The voltage-controlled oscillator 5500 generates an oscillation output signal SOUT that is oscillating with a frequency in response to the first oscillation control voltage SVCON1 and a second oscillation control voltage VCON2 in a normal mode. The second oscillation control voltage VCON2 is generated by the automatic frequency controller 5700. The frequency divider 5600 divides a frequency of the oscillation output signal SOUT to generate a first feedback signal SFEED in the normal mode, and provides the first feedback signal SFEED to the oscillation control voltage generating circuit. The fractional frequency divider 5650 divides the frequency of the oscillation output signal SOUT with a fractional number by controlling the frequency divider 5600. The fractional frequency divider 5650 may include a delta-sigma modulator (not shown).

The first selection circuit 5050 performs multiplexing on the input signal SIN and the oscillation output signal SOUT to generate a first selection signal SSIN, and performs multiplexing on the input signal SIN and the first feedback signal SFEED to generate a second feedback signal SSFEED in response to a pre-calibration enable signal PCAL_EN. The first selection circuit 5050 may include multiplexers 5051 and 5053.

The phase/frequency detector (PFD) 5100 generates a first up signal UP and a first down signal DN corresponding to a phase difference between the first selection signal SSIN and the second feedback signal SSFEED. The second selection circuit 5200 multiplexes the first up signal UP and a first reference voltage VR1 to generate a second up signal SUP and multiplexes the first down signal DN and a second reference voltage VR2 to generate a second down signal SDN in response to a pre-calibration enable signal PCAL_EN.

The oscillation control voltage generating unit 5300 generates the pump output current IOUT based on the second up signal SUP and the second down signal SDN, and integrates the pump output current IOUT to generate a first control voltage VCON. The charge pump 5310 generates an up current and a down current in response to the second up signal SUP and the second down signal SDN, and generates the pump output current IOUT corresponding to a magnitude difference between the up current and the down current in response to the second up signal SUP and the second down signal SDN. The loop filter 5330 integrates the pump output current IOUT to generate the first control voltage VCON.

The first switch 5400 outputs the second control voltage VCON1 corresponding to the first control voltage VCON in response to the pre-calibration enable signal PCAL_EN. The first switch 5400 may include a transmission gate 5410 and an inverter 5430. The third selection circuit 5450 performs multiplexing on the second control voltage VCON1 and a third reference voltage VREF1 to generate the first oscillation control voltage SVCON1 in response to a pre-calibration enable signal PCAL_EN.

The operation of the phase-locked-loop circuit 5000 of FIG. 15 is similar to the operation of the phase-locked-loop circuit 4000 according to the seventh example embodiment of the present invention shown in FIG. 13. Therefore, further description of the operation of the phase-locked-loop circuit 5000 will be omitted. In the phase-locked-loop circuit 5000, the oscillation output signal SOUT is applied to two inputs of the phase/frequency detector 5100 in the second pre-calibration mode.

Figure 16:
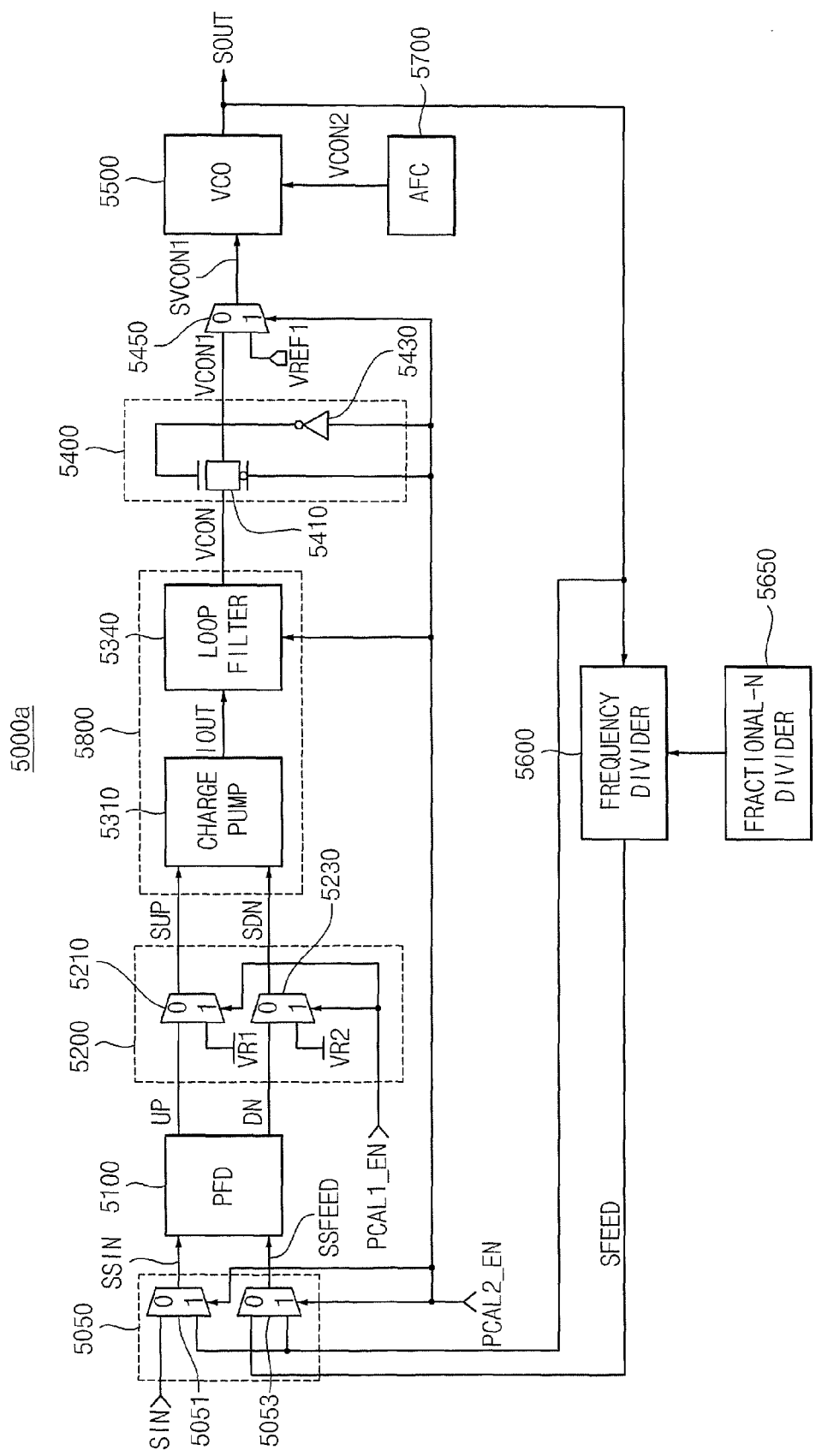
FIG. 16 is a circuit diagram illustrating a phase-locked-loop circuit according to a tenth example embodiment of the present invention.

FIG. 16 is a circuit diagram illustrating a phase-locked-loop circuit 5000a according to a tenth example embodiment of the present invention.

In the phase-locked-loop circuit 5000a according to the tenth example embodiment of the present invention, the structure of the loop filter 5340 included in the oscillation control voltage-generating unit 5800 is different from the loop filter 5330 included in the phase-locked-loop circuit 5000 according to the ninth example embodiment of the present invention. The oscillation control voltage generating unit 5800 shown in FIG. 16 controls the capacitance of the loop filter 5340 in response to the pre-calibration enable signal PCAL_EN, and integrates the pump output current IOUT to generate a first control voltage VCON.

While the example embodiments of the present invention and its advantages have been described in detail, it should be understood that various changes, substitutions and alterations can be made herein without departing from the scope of the invention as defined by appended claims.

What is claimed is:

1. A phase-locked loop (PLL) integrated circuit, comprising:
  an oscillation control voltage generating circuit configured to pre-scale an output current of a charge pump therein to a first level in response to disposing the PLL integrated circuit into a pre-calibration mode of operation;

a voltage-controlled oscillator configured to receive a first oscillation control voltage generated by said oscillation control voltage generating circuit during a normal mode of operation; and means, electrically coupled to said voltage-controlled oscillator and said oscillation control voltage generating circuit, for blocking transfer of the first oscillation control voltage from said oscillation control voltage generating circuit to said voltage-controlled oscillator during the pre-calibration mode of operation.

2. The PLL integrated circuit of claim 1, wherein said oscillation control voltage generating circuit is responsive to an input signal and a feedback signal; and wherein a magnitude of the first level during the pre-calibration mode of operation is independent of any phase difference between the input signal and the feedback signal.

3. The PLL integrated circuit of claim 1, further comprising an automatic frequency controller configured to generate a second oscillation control voltage; and wherein said voltage-controlled oscillator is responsive to the second oscillation control voltage during the pre-calibration mode of operation.

4. The PLL integrated circuit of claim 1, wherein said means for blocking transfer comprises a CMOS transmission gate responsive to a pre-calibration enable signal.

5. The PLL integrated circuit of claim 1, wherein said means for blocking transfer comprises a multiplexer having a control terminal responsive to the pre-calibration enable signal.

6. A phase-locked-loop circuit comprising:
an oscillation control voltage generating circuit comprising a charge pump, said oscillation control voltage generating circuit configured to perform pre-scaling on a pump output current in a pre-calibration mode while the charge pump remains active, and configured to generate a first oscillation control voltage based on an input signal and a first feedback signal in a normal mode;
a voltage-controlled oscillator configured to generate an oscillation output signal having a frequency in response to the first oscillation control voltage; and
a frequency divider configured to divide the frequency of the oscillation output signal to generate the first feedback signal, and configured to provide the first feedback signal to the oscillation control voltage generating circuit;
wherein the oscillation control voltage generating circuit comprises:
a phase detector configured to generate a first up signal and a first down signal corresponding to a phase difference between the input signal and the first feedback signal;
a first selection circuit configured to multiplex the first up signal and a first voltage to generate a second up signal and multiplex the first down signal and a second voltage generate a second down signal in response to a pre-calibration enable signal;
an oscillation control voltage generating unit configured to generate the pump output current based on the second up signal and the second down signal, and configured to integrate the pump output current to generate a first control voltage; and
a first switch configured to output the first oscillation control voltage corresponding to the first control voltage in response to the pre-calibration enable signal.

7. The phase-locked-loop circuit of claim 6, wherein the voltage-controlled oscillator is configured to control the frequency of the oscillation output signal in response to a second oscillation control voltage.

8. The phase-locked-loop circuit of claim 7, further comprising:
an automatic frequency controller configured to generate the second oscillation control voltage to provide the second oscillation control voltage to the voltage-controlled oscillator.

9. The phase-locked-loop circuit of claim 6, further comprising:
a fractional frequency divider configured to divide the frequency of the oscillation output signal by a fractional number by controlling the frequency divider.

10. The phase-locked-loop circuit of claim 6, wherein the oscillation control voltage generating unit comprises:
a loop filter configured to integrate the pump output current to generate the first control voltage.

11. The phase-locked-loop circuit of claim 6, wherein the oscillation control voltage generating unit is configured to output the pump output current to a first node, control capacitance between the first node and the ground in response to the pre-calibration enable signal, and integrate the pump output current to generate the first control voltage.

12. The phase-locked-loop circuit of claim 11, wherein the oscillation control voltage generating unit comprises:
a charge pump configured to generate an up current and a down current in response to the second up signal and the second down signal, and configured to generate the pump output current corresponding to an magnitude difference between the up current and the down current; and
a loop filter configured to control the capacitance between the first node and the ground in response to the pre-calibration enable signal, and integrate the pump output current to generate the first control voltage.

13. The phase-locked-loop circuit of claim 12, wherein the loop filter comprises:
an inverter for inverting the pre-calibration enable signal;
a first NMOS transistor having a drain coupled to the first node and a gate to which the pre-calibration enable signal is applied;
a second NMOS transistor having a drain coupled to the first node and a gate to which an output signal of the inverter is applied;
a first capacitor coupled between a source of the first NMOS transistor and the ground; and
a second capacitor coupled between a source of the second NMOS transistor and the ground.

14. The phase-locked-loop circuit of claim 12, wherein the loop filter comprises:
an inverter for inverting the pre-calibration enable signal;
a first NMOS transistor having a drain coupled to the first node, a gate to which the pre-calibration enable signal is applied, and a source coupled to a second node;
a second NMOS transistor having a drain coupled to the first node, a gate to which an output signal of the inverter is applied, and a source coupled to a third node;
a first capacitor coupled between the second node and the ground;
a second capacitor coupled between the third node and the ground;
a first switch having a first terminal and configured to be controlled by the pre-calibration enable signal, the first terminal being coupled to the second node;
a second switch having a first terminal and configured to be controlled by the pre-calibration enable signal, the first terminal being coupled to the third node; and a unit gain amplifier coupled between a second terminal of the first switch and a second terminal of the second switch.

15. A method of pre-calibrating a phase-locked-loop circuit, the method comprising:

generating a first up signal and a first down signal corresponding to a phase difference between an input signal and the first feedback signal;

multiplexing the first up signal and a first voltage to generate a second up signal in response to a pre-calibration enable signal;

multiplexing the first down signal and a second voltage to generate a second down signal in response to a pre-calibration enable signal;

generating the pump output current based on the second up signal and the second down signal;

integrating the pump output current to generate a first control voltage; and outputting the first oscillation control voltage corresponding to the first control voltage in response to the pre-calibration enable signal.

* * * * *